US012683604B2

(12) United States Patent
Kiguchi et al.

(10) Patent No.: US 12,683,604 B2
(45) Date of Patent: Jul. 14, 2026

(54) DRIVING APPARATUS

(71) Applicant: FUJI ELECTRIC CO., LTD.,
Kanagawa (JP)

(72) Inventors: Ryoga Kiguchi, Tachikawa-city (JP);
Hiromu Takubo, Hachioji-city (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 1037 days.

(21) Appl. No.: 17/844,053

(22) Filed: Jun. 20, 2022

(65) Prior Publication Data

US 2023/0053929 A1    Feb. 23, 2023

(30) Foreign Application Priority Data

Aug. 18, 2021    (JP) ................................. 2021-133583

(51) Int. Cl.
*H03K 17/00* (2006.01)
*H03K 17/687* (2006.01)

(52) U.S. Cl.
CPC ................................ *H03K 17/6872* (2013.01)

(58) Field of Classification Search
CPC ........... H03K 17/6872; H03K 17/6877; H03K
17/163; H03K 17/867
See application file for complete search history.

(56) References Cited

U.S. PATENT DOCUMENTS

| | | | | |
|---|---|---|---|---|
| 5,055,721 A | * | 10/1991 | Majumdar | ......... H03K 17/0828 |
| | | | | 327/434 |
| 6,270,709 B1 | * | 8/2001 | Akki | ........................ D01D 5/11 |
| | | | | 264/205 |
| 7,570,085 B2 | * | 8/2009 | Ishikawa | ............ H03K 17/0406 |
| | | | | 327/108 |
| 7,737,761 B2 | * | 6/2010 | Ishikawa | .............. H03K 17/168 |
| | | | | 327/434 |

(Continued)

FOREIGN PATENT DOCUMENTS

| | | |
|---|---|---|
| JP | 2000324801 A | 11/2000 |
| JP | 2008306618 A | 12/2008 |

(Continued)

OTHER PUBLICATIONS

Office Action issued for counterpart Japanese Application No.
2021-133583, transmitted from the Japanese Patent Office on Mar.
25, 2025 (drafted on Mar. 18, 2025).

*Primary Examiner* — Tuan T Lam

(57)    ABSTRACT

A driving apparatus for driving a switching device is pro-
vided, the driving apparatus including: a high potential line;
a high-potential-side switching control unit configured to
perform switching as to whether to connect a control ter-
minal of the switching device to the high potential line; a
first resistor element located on a high-potential side and
disposed in series with the high-potential-side switching
control unit on a path from the control terminal of the
switching device to the high potential line; a high-potential-
side capacitor provided in parallel with the first resistor (Continued)

element on the path from the control terminal of the switching device to the high potential line; and a high-potential-side discharge control unit configured to control whether to discharge the high-potential-side capacitor.

21 Claims, 23 Drawing Sheets

(56) References Cited

U.S. PATENT DOCUMENTS

| | | | | |
|---|---|---|---|---|
| 8,519,751 | B2 * | 8/2013 | Kitamura | H03K 17/04106 |
| | | | | 327/437 |
| 10,771,050 | B2 * | 9/2020 | Kaneda | H02M 1/32 |
| 2008/0303560 | A1 | 12/2008 | Higashi | |
| 2021/0359676 | A1 * | 11/2021 | Araki | H02P 6/28 |
| 2022/0029620 | A1 * | 1/2022 | Watanabe | H03K 17/063 |
| 2023/0021657 | A1 * | 1/2023 | Akiyama | H03K 17/145 |
| 2024/0063782 | A1 * | 2/2024 | Peng | H03K 17/063 |
| 2024/0178829 | A1 * | 5/2024 | Shimomura | H02M 1/08 |
| 2024/0364213 | A1 * | 10/2024 | Nosaka | H02M 7/537 |

FOREIGN PATENT DOCUMENTS

| | | | |
|---|---|---|---|
| JP | 2010045924 | A | 2/2010 |
| JP | 2017073969 | A | 4/2017 |
| JP | 2020027949 | * | 2/2020 |
| JP | 2020195019 | A | 12/2020 |

* cited by examiner

DRIVING APPARATUS

The contents of the following Japanese patent application(s) are incorporated herein by reference;
No. 2021-133583 filed in JP on Aug. 18, 2021.

BACKGROUND

1. Technical Field

The present invention relates to a driving apparatus for driving a switching device.

2. Related Art

Driving apparatuses for controlling switching devices such as transistors have conventionally been known (see, for example, patent document 1).

Patent Document 1: Japanese Patent Application Publication No. 2000-324801

DESCRIPTION OF EXEMPLARY EMBODIMENTS

Figure 1:
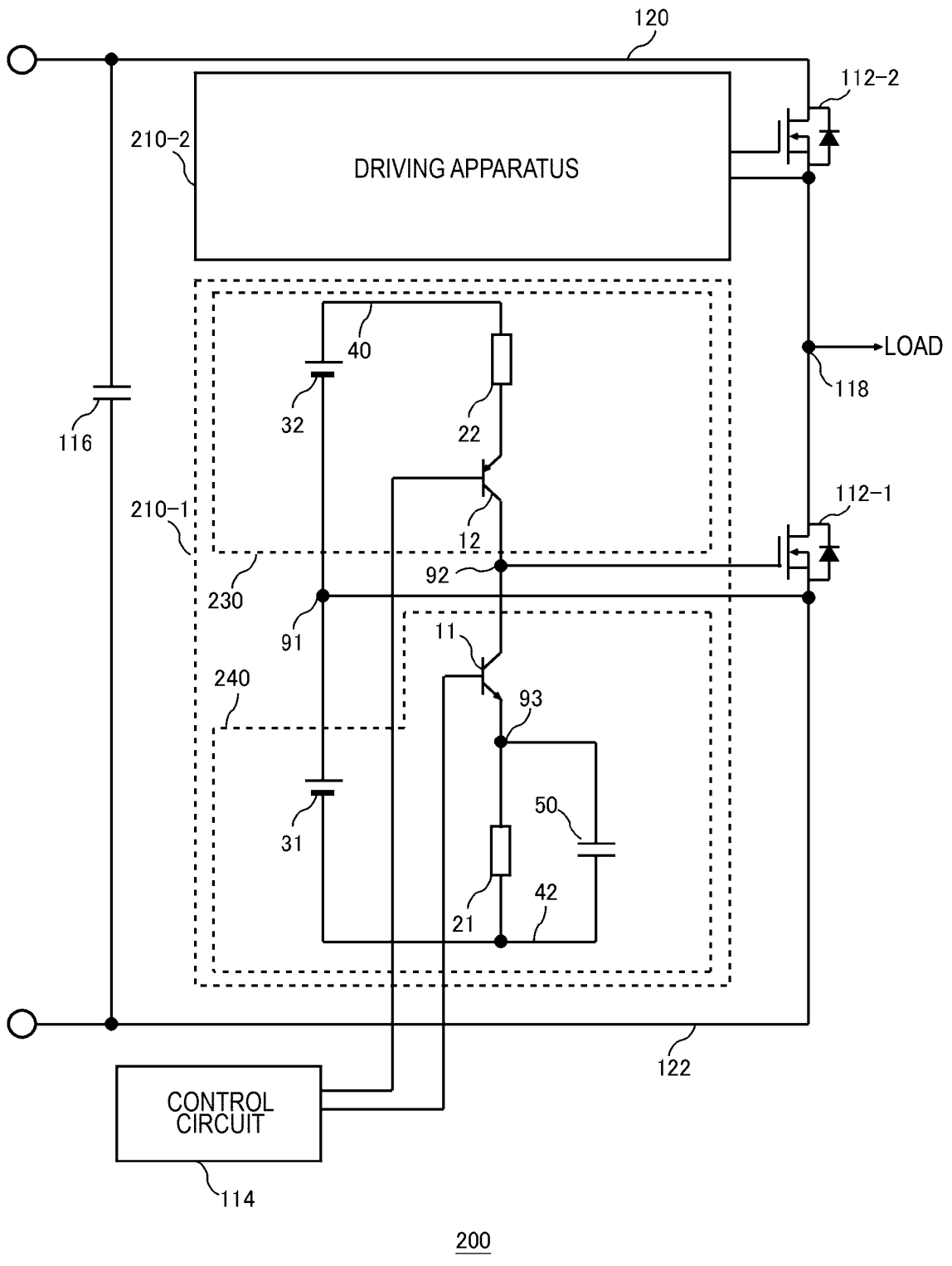
FIG. 1 shows an example of a power delivery circuit 200 according to a reference example.

The following describes the present invention by referring to embodiments thereof. However, the embodiments described hereinafter do not limit the invention as in the claims. Not all of the combinations of features described in the embodiments are necessarily essential for the solution of the invention. Elements herein or in the drawings that have substantially the same function or configuration are assigned the same reference symbol so as to avoid repetition in the description thereof, and elements that are not directly related to the present invention are omitted in the drawings. For elements in one drawing that have the same function or configuration, a reference symbol may be assigned to a representative element, and reference symbols for the others may be omitted.

Expressions such as "same" and "equal" herein may be used in the presence of an error resulting from, for example, a production tolerance. For example, the error may be 10% or less. An expression such as the "same" value or an "equal" value may be referred to as a close value in consideration of cost. A close value means, for example, employing an E series value in place of a non-series value, e.g., "3.1Ω is deemed as 3.3 Ω."

FIG. 1 shows an example of a power delivery circuit 200 according to a reference example. The power delivery circuit 200 delivers power to a load. The power delivery circuit 200 in this example includes switching devices 112-1 and 112-2, driving apparatuses 210-1 and 210-2, a control circuit 114, a high potential line 120, and a reference potential line 122.

As an example, the switching devices 112-1 and 112-2 may be, but are not limited to, transistors such as MOSFETs. Each of the switching devices 112 may include a drain terminal, a source terminal, and a gate terminal. When a switching device 112 is, for example, an insulated gate bipolar transistor (IGBT), the drain terminal and the source terminal may also be referred to as a collector terminal and an emitter terminal. The gate terminal is an example of a control terminal for controlling the on/off state of the switching device 112.

The switching devices 112-1 and 112-2 in this example are connected in series between the high potential line 120 and the reference potential line 122. A reference potential such as a ground potential is applied to the reference potential line 122. A high potential that is higher than the reference potential is applied to the high potential line 120. An external power source may be connected to the reference potential line 122 and the high potential line 120. A capacitor 116 may be connected between the reference potential line 122 and the high potential line 120.

In this example, the drain terminal of the switching device 112-2 is connected to the high potential line 120, and the drain terminal of the switching device 112-1 is connected to the source terminal of the switching device 112-2. The source terminal of the switching device 112-1 is connected to the reference potential line 122.

The power delivery circuit 200 delivers power to the load from a connection point 118 between the switching devices 112-1 and 112-2. The on/off states of the switching devices 112-1 and 112-2 are switched complementarity with each other. That is, when one of the switching devices 112 is in an on state, the other switching device 112 is controlled to be placed in an off state. In this way, switching is performed as to which of the high potential line 120 or the reference potential line 122 the load is to be connected to.

The driving apparatus 210-1 controls the switching device 112-1 so as to switch between the on state and the off state. The driving apparatus 210-2 controls the switching device 112-2 so as to switch between the on state and the off state. The driving apparatus 210-2 may have a similar structure and functions to the driving apparatus 210-1. With respect to this example, the structure and operations of the driving apparatus 210-1 are described, and descriptions of the driving apparatus 210-2 are omitted. Note that the driving apparatus 210-1 may simply be referred to as the driving apparatus 210 herein.

The driving apparatus 210 generates a control signal to be input to the gate terminal of the switching device 112. Note that the switching device 112-1 may simply be referred to as the switching device 112 herein. The driving apparatus 210 includes a high-potential-side circuit 230 and a reference-potential-side circuit 240. The reference-potential-side circuit 240 includes: a first switching control unit 11; and a first resistor element 21, a first power source 31, and a first capacitor 50, which are provided on the reference-potential side. The high-potential-side circuit 230 includes: a second switching control unit 12; and a first resistor element 22 and a second power source 32, which are provided on the high-potential side.

The first power source 31 and the second power source 32 are disposed in series between the high potential line 40 and the reference potential line 42. The first power source 31 and the second power source 32 generate a voltage between the high potential line 40 and the reference potential line 42. A connection point 91 between the first power source 31 and the second power source 32 may be connected to the source terminal of the switching device 112.

The first switching control unit 11 and the second switching control unit 12 control the switching of the on/off state of the switching device 112. The first switching control unit 11 and the second switching control unit 12 in this example are transistors that are disposed in series between the high potential line 40 and the reference potential line 42 and complementarity operated. Each of the transistors indicated herein and the drawings may be a bipolar transistor, a MOSFET, an IGBT, a wide bandgap semiconductor element containing at least one of silicon carbide, gallium nitride, gallium oxide, or diamond as a main material, or another semiconductor switching device. A connection point 92 between the first switching control unit 11 and the second switching control unit 12 is connected to the control terminal (gate terminal) of the switching device 112.

The first switching control unit 11 controls whether to connect the control terminal of the switching device 112 to the reference potential line 42. In this example, when the first switching control unit 11 is in the on state, the control terminal of the switching device 112 is connected to the reference potential line 42. The second switching control unit 12 controls whether to connect the control terminal of the switching device 112 to the high potential line 40. In this example, when the second switching control unit 12 is in the on state, the control terminal of the switching device 112 is connected to the high potential line 40.

The control circuit 114 controls the on/off states of the first switching control unit 11 and the second switching control unit 12. The control circuit 114 may generate a control signal to be applied to the control terminals of the first switching control unit 11 and the second switching control unit 12.

The first resistor element 21 is provided in series with the first switching control unit 11 on a path between the control terminal of the switching device 112 and the reference potential line 42. The first resistor element 21 in this example is disposed between the first switching control unit 11 and the reference potential line 42. However, the first resistor element 21 may be disposed between the connection point 92 and the first switching control unit 11. Turning on the first switching control unit 11 causes charge accumulated in the gate capacitance of the switching device 112 to be taken into the reference potential line 42 through the first resistor element 21. Thus, the rate of turning off the switching device 112 can be adjusted by using the resistance value of the first resistor element 21 so as to adjust the time rate of change (also referred to as di/dt) in the main current of the switching device 112 (drain current Id in this example). When the switching device 112 performs a turn-off operation, a surge voltage corresponding to the time rate of change in the main current of the switching device 112 is generated at main terminals (source terminal and drain terminal in this example) of the switching device 112.

The first resistor element 22 is provided in series with the second switching control unit 12 on a path between the control terminal of the switching device 112 and the high potential line 40. The first resistor element 22 in this example is disposed between the second switching control unit 12 and the high potential line 40. However, the first resistor element 22 may be disposed between the connection point 92 and the second switching control unit 12. Turning on the second switching control unit 12 causes charge to be transferred from the high potential line 40 through the first resistor element 22 and charge the gate capacitance of the switching device 112. Thus, the rate of turning on the switching device 112 can be adjusted by using the resistance value of the first resistor element 22 so as to adjust the time rate of change (also referred to as di/dt) in the main current of the switching device 112 (drain current Id in this example). When the switching device 112-1 performs a turn-on operation, a reverse-recovery surge voltage corresponding to the time rate of change in the main current of the switching device 112-1 is generated at main terminals (source terminal and drain terminal in this example) of the other switching device (in this case, switching device 112-2).

As indicated above, increasing the resistance value of the first resistor element 21 can decrease the time rate of change in the main current so as to suppress the surge voltage. However, increasing the resistance value of the first resistor element 21 causes the switching device 112 to discharge gate charge for a long time, thereby extending the period of time from the start of the turn-off operation of the switching device 112 to the completion thereof (referred to as a turn-off time herein). Hence, the switching device 112 has increased turn-off loss. Note that the completion of turn-off may be a timing at which interruption of the main current of the switching device 112 is completed or a timing at which the voltage across the main terminals after generation of the surge voltage matches the voltage of the capacitor 116.

Likewise, increasing the resistance value of the first resistor element 22 can decrease the time rate of change in the main current Id so as to suppress the reverse-recovery surge voltage. However, increasing the resistance value of the first resistor element 22 causes the switching device 112 to be charged with gate charge for a long time, thereby extending the period of time from the start of the turn-on operation of the switching device 112 to the completion thereof (referred to as a turn-on time herein).

Hence, the switching device 112 has increased turn-on loss. Note that the completion of turn-on may be a timing at which the main current of the switching device 112 becomes equal to the current flowing through the load or a timing at which the voltage across the main terminals becomes zero. Decreasing the resistance value of the first resistor element 21 can shorten the turn-off time of the switching device 112 so as to reduce turn-off loss. However, the surge voltage increases.

Decreasing the resistance value of the first resistor element 22 can shorten the turn-off time of the switching device 112 so as to reduce turn-on loss. However, the reverse-recovery surge voltage increases.

Semiconductor apparatuses in recent years have an increased operating frequency, so the switching device 112 is preferably capable of performing high-speed operations. To allow the switching device 112 to perform high-speed operations, both suppression of the surge voltage and suppression of the turn-off time and turn-off loss are preferably attained. Likewise, to allow the switching device 112 to perform high-speed operations, both suppression of the surge voltage and suppression of the turn-on time and turn-on loss are preferably attained.

The power delivery circuit 200 includes the first capacitor 50, which is provided in parallel with the first resistor element 21 on a path from the control terminal of the switching device 112 to the reference potential line 42. The first capacitor 50 in this example is provided in parallel with the first resistor element 21 between the reference potential line 42 and a connection point 93 between the first switching control unit 11 and the first resistor element 21.

Providing the first capacitor 50 causes, directly after the first switching control unit 11 is placed in the on state, gate charge of the switching device 112 to move to the first capacitor 50 through the first switching control unit 11. In this case, the gate charge does not pass through the first resistor element 21. Hence, the gate voltage of the switching device 112 immediately decreases. Accordingly, the turn-off time of the switching device 112 can be shortened.

After charge is sufficiently accumulated in the first capacitor 50, gate charge of the switching device 112 moves to the reference potential line 42 mainly through the first switching control unit 11 and the first resistor element 21. Hence, the time rate of change in the main current can be adjusted by the first resistor element 21 so as to suppress the surge voltage.

As described above, providing the first capacitor 50 allows for the shortening of the turn-off time of the switching device 112 and suppression of the surge voltage. Likewise, providing the second capacitor in parallel with the first resistor element 22 allows for the shortening of the turn-on time of the switching device 112 and suppression of the surge voltage.

However, when the switching device 112 is repeatedly turned on and off, if the charge accumulated in the first capacitor 50 at a previous turn-off is not sufficiently discharged before the next turn-off, sufficient gate charge cannot move to the first capacitor 50 at the next turn-off. In this case, the turn-off time cannot be shortened. This is also true for the second capacitor in the turn-on operation.

In this example, the first resistor element 21 also serves as a discharge circuit for the first capacitor 50. Thus, the charge accumulated in the first capacitor 50 is discharged via the first resistor element 21. Hence, increasing the resistance value of the first resistor element 21 for the purpose of suppressing the surge voltage may slow down discharge of the accumulated charge in the first capacitor 50, thereby disabling the accumulated charge from being sufficiently discharged before the next turn-off is performed. Particularly when the switching device 112 performs a high-speed operation, discharge from the first capacitor 50 may not be finished in time. Decreasing the resistance value of the first resistor element 21 shortens the discharge time of the first capacitor 50 but makes the surge voltage less likely to be suppressed. Similarly, providing the second capacitor in parallel with the first resistor element 22 causes the first resistor element 22 to serve also as a discharge circuit for the second capacitor. Hence, increasing the resistance value of the first resistor element 22 for the purpose of suppressing the surge voltage may slow down discharge from the second capacitor, thereby disabling the second capacitor from being sufficiently discharged before the next turn-on is performed. Particularly when the switching device 112 performs a high-speed operation, discharge from the second capacitor may not be finished in time. Decreasing the resistance value of the first resistor element 22 shortens the discharge time of the second capacitor but makes the surge voltage less likely to be suppressed.

Figure 2:
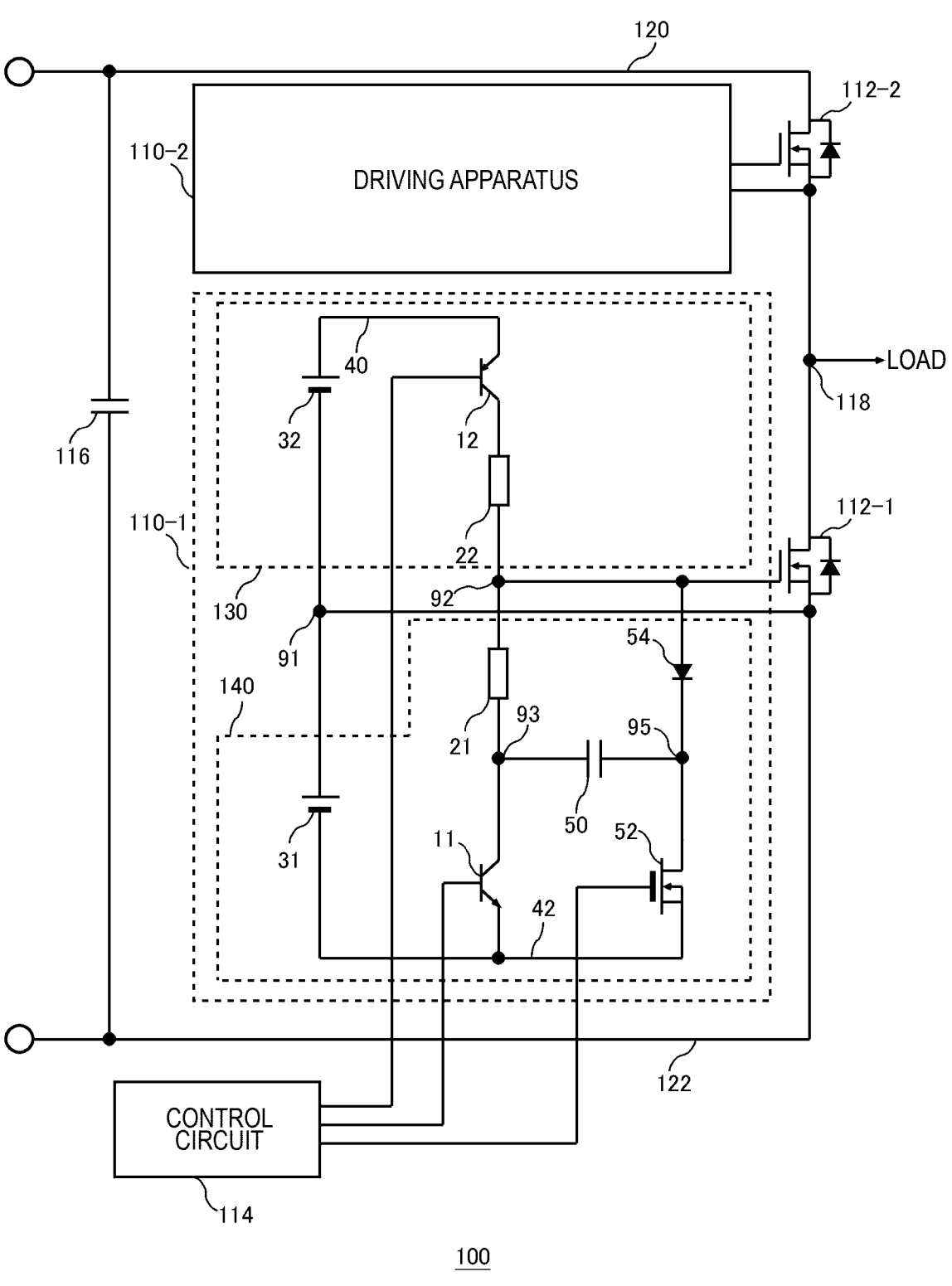
FIG. 2 shows a configuration example of a power delivery circuit 100.

FIG. 2 shows a configuration example of a power delivery circuit 100. The power delivery circuit 100 includes driving apparatuses 110-1 and 110-2, in place of the driving apparatuses 210-1 and 210-2 shown in FIG. 1. The configuration of the power delivery circuit 100 is similar to the power delivery circuit 200 shown in FIG. 1 except for the driving apparatuses 110. The driving apparatus 110-2 may have a similar configuration and functions to the driving apparatus 110-1. With respect to this example, the structure and operations of the driving apparatus 110-1 are described, and descriptions of the driving apparatus 110-2 are omitted. Note that the driving apparatus 110-1 may simply be referred to as the driving apparatus 110 herein.

The driving apparatus 110 drives the switching device 112. The driving apparatus 110 includes a high-potential-side circuit 130 and a reference-potential-side circuit 140. As with the driving apparatus 210, the driving apparatus 110 includes a first power source 31, a second power source 32, a first switching control unit 11, a second switching control unit 12, a first resistor element 21, a first resistor element 22, and a first capacitor 50. Among these configurations, the first power source 31, the first switching control unit 11, the first resistor element 21, and the first capacitor 50 are included in the reference-potential-side circuit 140. The first switching control unit 11 is an example of a reference-potential-side switching control unit. The first capacitor 50 is an example of a reference-potential-side capacitor. The second power source 32, the second switching control unit 12, and the first resistor element 22 are included in the high-potential-side circuit 130. The second switching control unit 12 is an example of a high-potential-side switching control unit. In the example of FIG. 2, the first resistor element 21 is disposed between the connection point 92 and the first switching control unit 11, and the first resistor element 22 is disposed between the connection point 92 and the second switching control unit 12. In another example, the first resistor element 21 may be disposed between the first switching control unit 11 and the reference potential line 42. The first resistor element 22 may be disposed between the second switching control unit 12 and the high potential line 40.

The first capacitor 50 is provided in parallel with the first resistor element 21 on a path from the control terminal of the switching device 112 to the reference potential line 42. The first capacitor 50 in this example is disposed in parallel with the first resistor element 21 between the control terminal of the switching device 112 and the first switching control unit 11 (or connection point 93). The connection point 93 is a connection point between the first resistor element 21 and the first switching control unit 11.

The reference-potential-side circuit 140 further includes a first discharge control unit 52 for controlling whether to discharge the first capacitor 50. The first discharge control unit 52 is an example of a reference-potential-side discharge control unit. The first discharge control unit 52 is provided separately from the first switching control unit 11. The first discharge control unit 52 in this example is a first transistor for performing switching as to whether to connect an electrode of the first capacitor 50 on the switching-device-112 side to the reference potential line 42. The first transistor is an example of a reference-potential-side transistor. When the first switching control unit 11 is in the on state and the first discharge control unit 52 is in the on state, both ends of the first capacitor 50 are connected to the reference potential line 42. This allows the first capacitor 50 to be discharged without the intervention of the first resistor element 21. Note that the on resistance of the first switching control unit 11 and the first discharge control unit 52 is sufficiently lower than that of the first resistor element 21.

The first discharge control unit 52 is placed into the on state after a timing at which the first switching control unit 11 is placed into the on state. Thus, for a predetermined period after the first switching control unit 11 is placed into the on state, the gate charge of the switching device 112 moves to the first capacitor 50, thereby immediately decreasing the gate voltage of the switching device 112. Accordingly, the turn-off time of the switching device 112 can be shortened. Placing the first discharge control unit 52 in the on state causes the accumulated charge in the first capacitor 50 to be discharged without the intervention of the first resistor element 21. Hence, the accumulated charge in the first capacitor 50 can be immediately discharged, and even when the switching device 112 performs a high-speed operation, the first capacitor 50 can be sufficiently discharged. In addition, the surge voltage can be suppressed by adjusting the resistance value of the first resistor element 21.

The control circuit 114 may control the on/off state of the first discharge control unit 52. The control circuit 114 may control the first discharge control unit 52 on the basis of a timing at which the first switching control unit 11 is placed into the on state. For example, the first discharge control unit 52 may be placed into the on state when a predetermined period of time has elapsed after the first switching control unit 11 was placed into the on state. The control circuit 114 may control the first discharge control unit 52 on the basis of the state of any of the driving apparatuses 110-1 and 110-2 and the switching devices 112-1 and 112-2. Note that the state of each apparatus and element may be an instantaneous value or time waveform of a voltage or current at a predetermined position on the circuit.

The reference-potential-side circuit 140 may further include a first diode 54. The first diode 54 is an example of a reference-potential-side diode. The first diode 54 is disposed in parallel with the first resistor element 21 between the control terminal of the switching device 112 and the first capacitor 50. The first diode 54 is disposed such that a direction from the switching device 112 toward the first capacitor 50 is a forward direction. Providing the first diode 54 prevents the accumulated charge in the first capacitor 50 from being discharged via the first resistor element 21. The first discharge control unit 52 in this example is disposed between the reference potential line 42 and a connection point 95 between the first diode 54 and the first capacitor 50.

Figure 3:
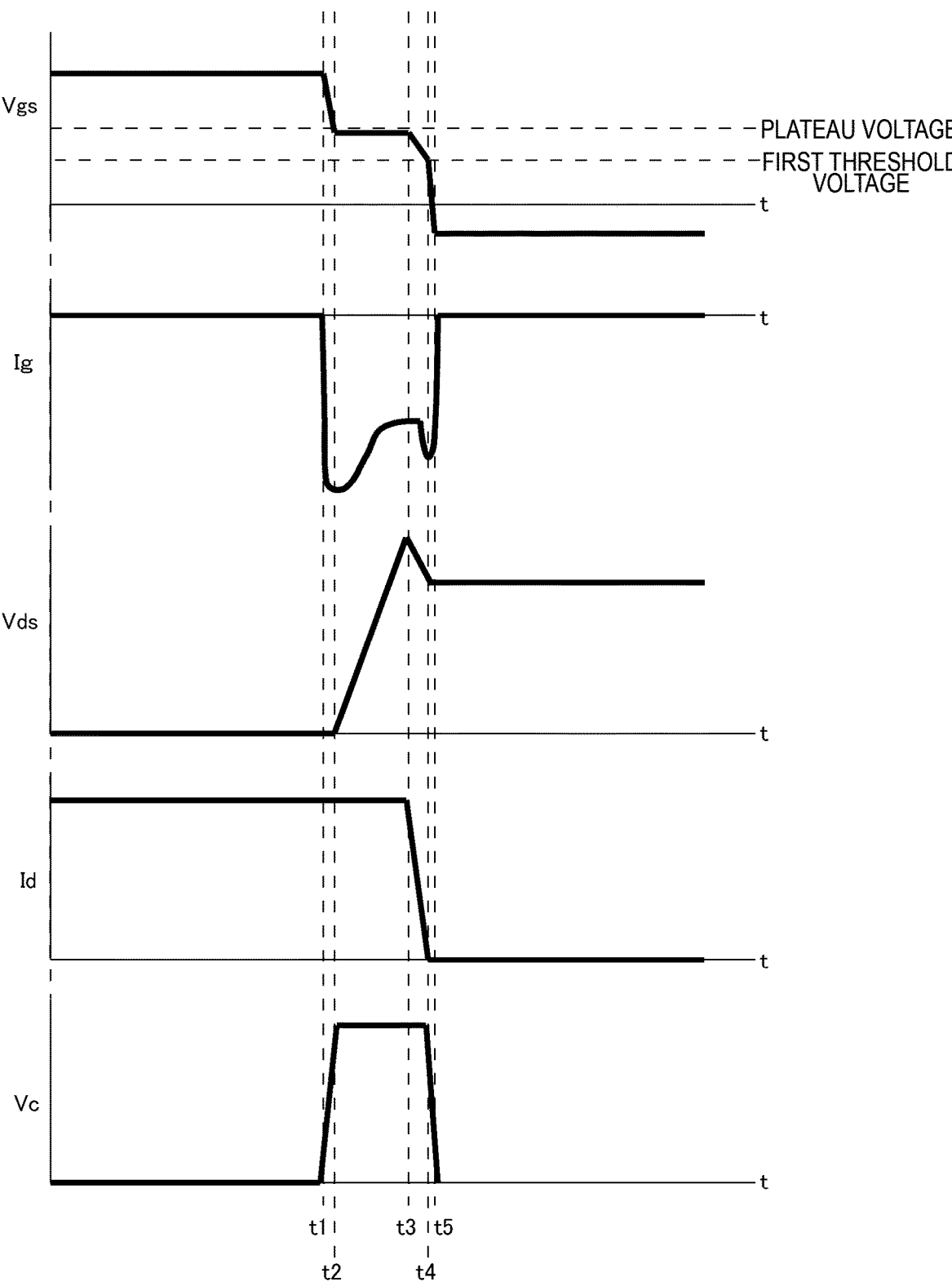
FIG. 3 shows operation examples of a switching device 112-1 and a reference-potential-side circuit 140 at turn-off.

FIG. 3 shows operation examples of the switching device 112-1 and the reference-potential-side circuit 140 at turn-off. The horizontal axes in FIG. 3 indicate time, and the vertical axes therein indicate the magnitude of voltage or current. Vgs indicate the gate voltage (gate-source voltage) of the switching device 112, Ig indicates the gate current thereof, Vds indicates the voltage across the main terminals thereof, Id indicates the main current thereof, and Vc indicates the voltage of the first capacitor 50.

With respect to an initial state in FIG. 3, the switching device 112 is in the on state. At a timing t1, the first switching control unit 11 transitions from the off state to the on state. Thus, the gate current Ig flows, thereby causing the gate charge in the switching device 112 moves to the first capacitor 50. The gate voltage Vgs immediately decreases, and the capacitor voltage Vc increases. FIG. 3 is based on the assumption that the gate current Ig which flows into the control terminal of the switching device 112 is positive and that the gate current which flows out of the control terminal of the switching device 112 is negative. The gate charge moves to the first capacitor 50 until a timing t2 at which the gate voltage Vgs decreases to a plateau voltage of the switching device 112. The plateau voltage will be described hereinafter. The first capacitor 50 may have a capacitance such that the gate charge can be moved and accumulated to match the gate voltage Vgs of the switching device 112 with the plateau voltage, or may have a capacitance such that the gate charge can be moved and accumulated until the gate voltage Vgs of the switching device 112 becomes no higher than the plateau voltage.

At the moment at which the gate voltage Vgs has decreased to the plateau voltage and after this moment (at t2 and thereafter), the gate charge in the switching device 112 flows to the reference potential line 42 through the first resistor element 21 and the first switching control unit 11. The gate current Ig becomes relatively small according to the resistance value of the first resistor element 21. The switching device 112 starts to be turned off, so the voltage Vds across the main terminals gradually increases.

When a predetermined period has elapsed after the gate voltage Vgs decreased to the plateau voltage, the gate voltage Vgs starts to be smaller than the plateau voltage (timing t3). For example, the gate voltage Vgs may start to decrease when the charge of a feedback capacitance Crss (or gate-drain capacitance Cgd) of the switching device 112 finishes being discharged. The length of the period t2-t3 may be 0. The time rate of change (di/dt) in the main current Id, which affects the magnitude of the surge voltage, is determined by the magnitude of the gate current Ig up to the period t2-t3. In this example, the gate current Ig in this period can be adjusted by the first resistor element 21 so that the surge voltage can be suppressed.

In the example of FIG. 2, the first discharge control unit 52 discharges the first capacitor 50 at a predetermined timing t4 after the timing t3. In the example of FIG. 3, the first discharge control unit 52 is placed into the on state with the condition that the gate voltage Vgs is equal to or lower than a first threshold voltage. The first threshold voltage is smaller than the plateau voltage. Thus, the capacitor voltage Vc of the first capacitor 50 immediately decreases, so even when the switching device 112 performs a high-speed operation, the first capacitor 50 can be sufficiently discharged. The gate current Ig of the switching device 112 flows to the reference potential line 42 through the first discharge control unit 52. Hence, the gate voltage Vgs can also immediately decrease. Although placing the first discharge control unit 52 into the on state at the timing t4 increases the gate current Ig, this does not affect the magnitude of the surge voltage generated at the timing t3.

As indicated above, the examples shown in FIGS. 2 and 3 allow for providing the driving apparatus 110 that can address an increase in the operating frequency of the switching device 112 while attaining both suppression of the surge voltage of the switching device 112 and shortening of the turn-off time thereof.

The plateau voltage may be a voltage satisfying one or more of the following conditions (1)-(3).

(1) A gate-source voltage Vgs within a region between inflection points on a characteristic curve for the gate charge and the Vgs of the switching device 112.

(2) A gate voltage Vgs in a period in the switching operation of the switching device in which the main current Id does not change while a drain-source voltage Vds changes.

(3) A gate voltage Vgs during discharge of the feedback capacitance Crss (or gate-drain capacitance Cgd) of the MOSFET.

When a specification value for the plateau voltage is set by, for example, the manufacturer of the switching device 112, this specification value may be used.

The first threshold voltage may be defined by any of the following (4)-(6), or when a specification value for the threshold voltage is set by, for example, the manufacturer of the switching device 112, this specification value may be used.

(4) A gate voltage Vgs attained when the main current Id is 0. Note that situations in which the main current Id is 0 include a situation in which the main current Id is substantially 0, such as a situation in which the main current is equal to or less than the measurement resolution of a measuring instrument.

(5) A gate voltage Vgs attained when a main current Id corresponding to 0.1% of the rated current of the switching device 112 flows. The value of the main current Id used in this case may be a value that is sufficiently less than the rated current, such as 1% or less of the rated current, so the value is not limited to 0.1% of the rated current.

(6) A gate voltage Vgs attained when the main current Id flowing through the switching device 112 is equal to a leakage current at the time of interruption during the off state. The fact that the gate voltage Vgs is equal to the leakage current at the time of interruption includes a situation in which the gate voltage Vgs is substantially equal to the leakage current, such as a situation in which the difference is equal to or less than the measurement resolution of a measuring instrument.

At the timing t4 and thereafter, the first discharge control unit 52 is in the on state, so the control terminal of the switching device 112 and the reference potential line 42 are equivalently in a shorted state. Hence, the gate-source voltage Vgs of the switching device 112 is fixed at a reverse bias voltage, so that the switching device 112 can be prevented from being accidentally placed into the on state. Thus, the first discharge control unit 52 also functions as an active mirror clamp circuit for preventing the switching device 112 from being accidentally turned on.

Accordingly, discharge of the first capacitor 50 needs to be completed, at the latest, by the start of the next turning-on of the switching device. Until next time the switching device is turned on, the first capacitor 50 may be discharged during a dead time period of the pair of switching devices 112-1 and

112-2 operated in a complementary manner. The dead time period refers to a period in which both of the switching devices 112 are in the off state (or controlled to be in the off state).

At the moment at which the gate voltage of the switching device falls below the first threshold voltage, the first discharge control unit 52 may be turned on to cause the first discharge control unit 52 to function as an active mirror clamp circuit.

The control circuit 114 may control the first discharge control unit 52 on the basis of at least one of the gate voltage Vgs, the gate current Ig, the voltage Vds across the main terminals, or the main current Id. On the basis of at least one of these values, the control circuit 114 may estimate a timing t3 at which the gate voltage Vgs starts to be smaller than the plateau voltage. For example, the control circuit 114 may detect, as t3, a timing at which the voltage Vds across the main terminals indicates a peak, or detect, as t3, a timing at which the main current Id starts to decrease from a steady state value. The control circuit 114 may control the first discharge control unit 52 so as to place the same into the on state at a predetermined timing after the timing t3.

Figure 4:
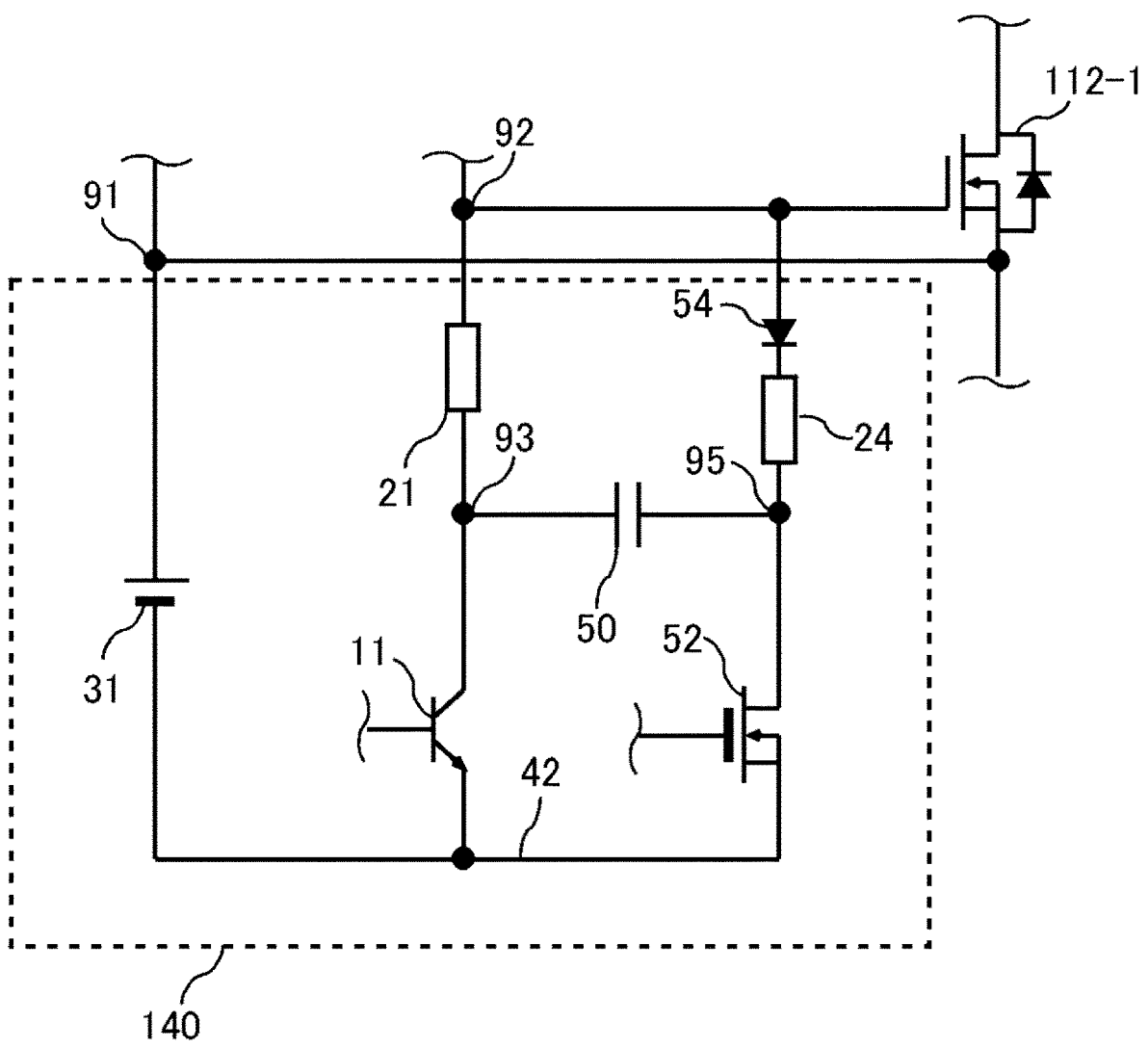
FIG. 4 shows another configuration example of the reference-potential-side circuit 140.

FIG. 4 shows another configuration example of the reference-potential-side circuit 140. In addition to the configuration of the reference-potential-side circuit 140 described above by referring to FIG. 2, the reference-potential-side circuit 140 in this example includes a second resistor element 24 on the reference-potential side. The second resistor element 24 is disposed in series with the first diode 54 between the control terminal of the switching device 112 and a connection point 95 between the first capacitor 50 and the first discharge control unit 52. In the example of FIG. 4, the second resistor element 24 is disposed between the first diode 54 and the connection point 95. In another example, however, the second resistor element 24 may be disposed between the first diode 54 and the control terminal of the switching device 112. Disposing the second resistor element 24 in such a manner allows a current flowing through the first diode 54 to be equal to or lower than a limiting value of the first diode 54 without decreasing the discharge rate of the first capacitor 50.

The second resistor element 24 may be provided to adjust a current that flows through the first diode 54. For example, the second resistor element 24 may be provided to prevent a current exceeding a rating from flowing through the first diode 54. To shorten the turn-off time, the resistance value of the second resistor element 24 is preferably lower than the resistance value of the first resistor element 21.

The resistance value of the second resistor element 24 may be adjusted to adjust a current that flows from the control terminal of the switching device 112 to the first capacitor 50. In this way, the time rate of change in the voltage Vds across the main terminals can be adjusted. In addition, the resistance value of the first resistor element 21 may be adjusted to adjust a current that flows from the control terminal of the switching device 112 through the first resistor element 21 and the first switching control unit 11 to the reference potential line 42. In this way, the time rate of change in the main current Id can be adjusted. Thus, in this example, the first resistor element 21 and the second resistor element 24 may be separately adjusted to individually adjust the time rate of change in the voltage Vds across the main terminals and the time rate of change in the main current Id. Accordingly, the switching speed can be increased without increasing the surge voltage, so that switching loss can be reduced.

Figure 5:
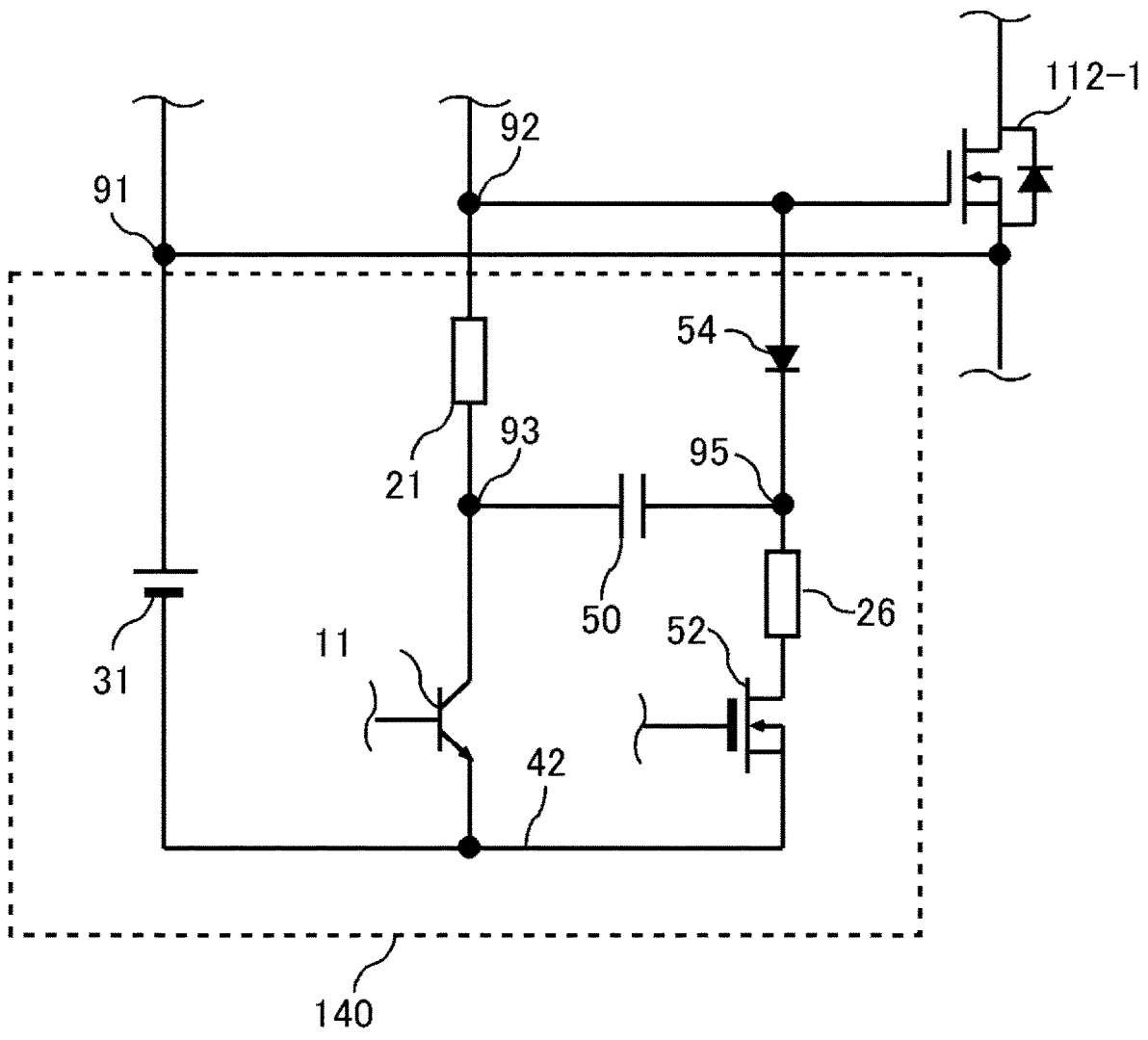
FIG. 5 shows another configuration example of the reference-potential-side circuit 140.

FIG. 5 shows another configuration example of the reference-potential-side circuit 140. In addition to the configuration of any of the reference-potential-side circuits 140 described above by referring to FIG. 2-4, the reference-potential-side circuit 140 in this example includes a third resistor element 26 on the reference-potential side. As shown in FIG. 4, the reference-potential-side circuit 140 may include the second resistor element 24. The third resistor element 26 is disposed in series with the first discharge control unit 52 between the connection point 95 and the reference potential line 42. In the example of FIG. 5, the third resistor element 26 is disposed between the first discharge control unit 52 and the connection point 95. In another example, however, the third resistor element 26 may be disposed between the first discharge control unit 52 and the reference potential line 42. Disposing the third resistor element 26 in such a manner allows a current flowing through the first discharge control unit 52 to be equal to or lower than a limiting value of the first discharge control unit 52 without increasing the turn-off time.

The third resistor element 26 may be provided to adjust a current that flows through the first discharge control unit 52. For example, the third resistor element 26 may be provided to prevent a current exceeding a rating from flowing through the first discharge control unit 52. To shorten the turn-off time, the resistance value of the third resistor element 26 is preferably lower than the resistance value of the first resistor element 21.

Figure 6:
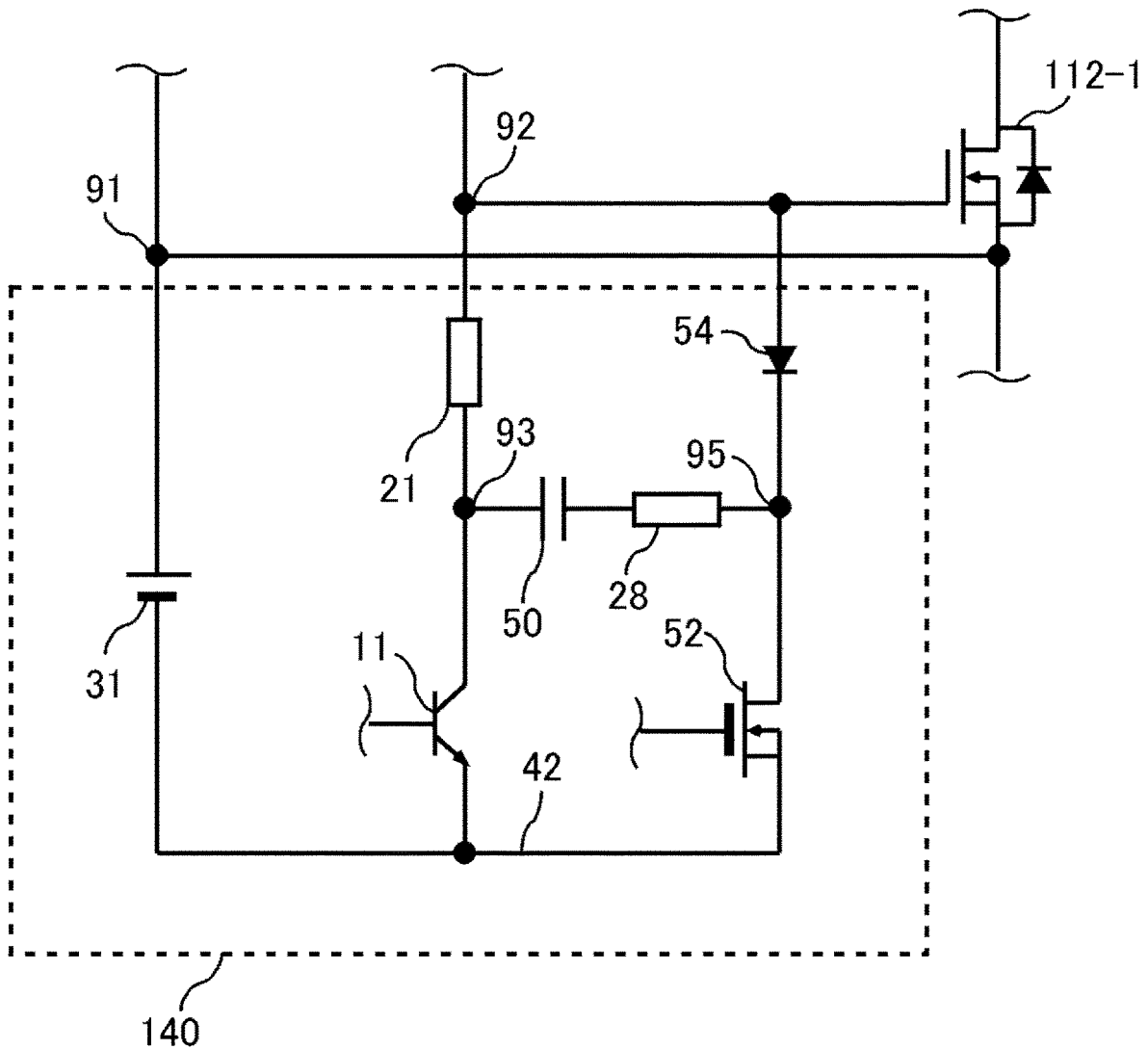
FIG. 6 shows another configuration example of the reference-potential-side circuit 140.

FIG. 6 shows another configuration example of the reference-potential-side circuit 140. In addition to the configuration of any of the reference-potential-side circuits 140 described above by referring to FIG. 2-5, the reference-potential-side circuit 140 in this example includes a fourth resistor element 28 on the reference-potential side. As shown in FIGS. 4 and 5, the reference-potential-side circuit 140 may include at least one of the second resistor element 24 or the third resistor element 26. The fourth resistor element 28 is disposed in series with the first capacitor 50 between the connection points 93 and 95. In the example of FIG. 6, the fourth resistor element 28 is disposed between the connection point 93 and the first capacitor 50. In another example, however, the fourth resistor element 28 may be disposed between the connection point 95 and the first capacitor 50. Disposing the fourth resistor element 28 in such a manner allows a current flowing through the first capacitor 50 to be equal to or lower than a limiting value of the first capacitor 50 without decreasing the effect of the mirror clamp circuit of the first discharge control unit 52.

The fourth resistor element 28 may be provided to adjust a current that flows through the first capacitor 50. For example, the fourth resistor element 28 may be provided to prevent a current exceeding a rating from flowing through the first capacitor 50 or the first diode 54. To shorten the turn-off time, the resistance value of the fourth resistor element 28 is preferably lower than the resistance value of the first resistor element 21.

The resistance value of the fourth resistor element 28 may be adjusted to adjust a current that flows from the control terminal of the switching device 112 to the first capacitor 50. In this way, the time rate of change in the voltage Vds across the main terminals can be adjusted. In addition, the resistance value of the first resistor element 21 may be adjusted to adjust a current that flows from the control terminal of the switching device 112 through the first resistor element 21 and the first switching control unit 11 to the reference potential line 42. In this way, the time rate of change in the main current Id can be adjusted. Thus, in this example, the first resistor element 21 and the fourth resistor element 28 may be separately adjusted to individually adjust the time rate of change in the voltage Vds across the main terminals and the time rate of change in the main current Id. Accordingly, the switching speed can be increased without increasing the surge voltage, so that switching loss can be reduced.

Figure 7:
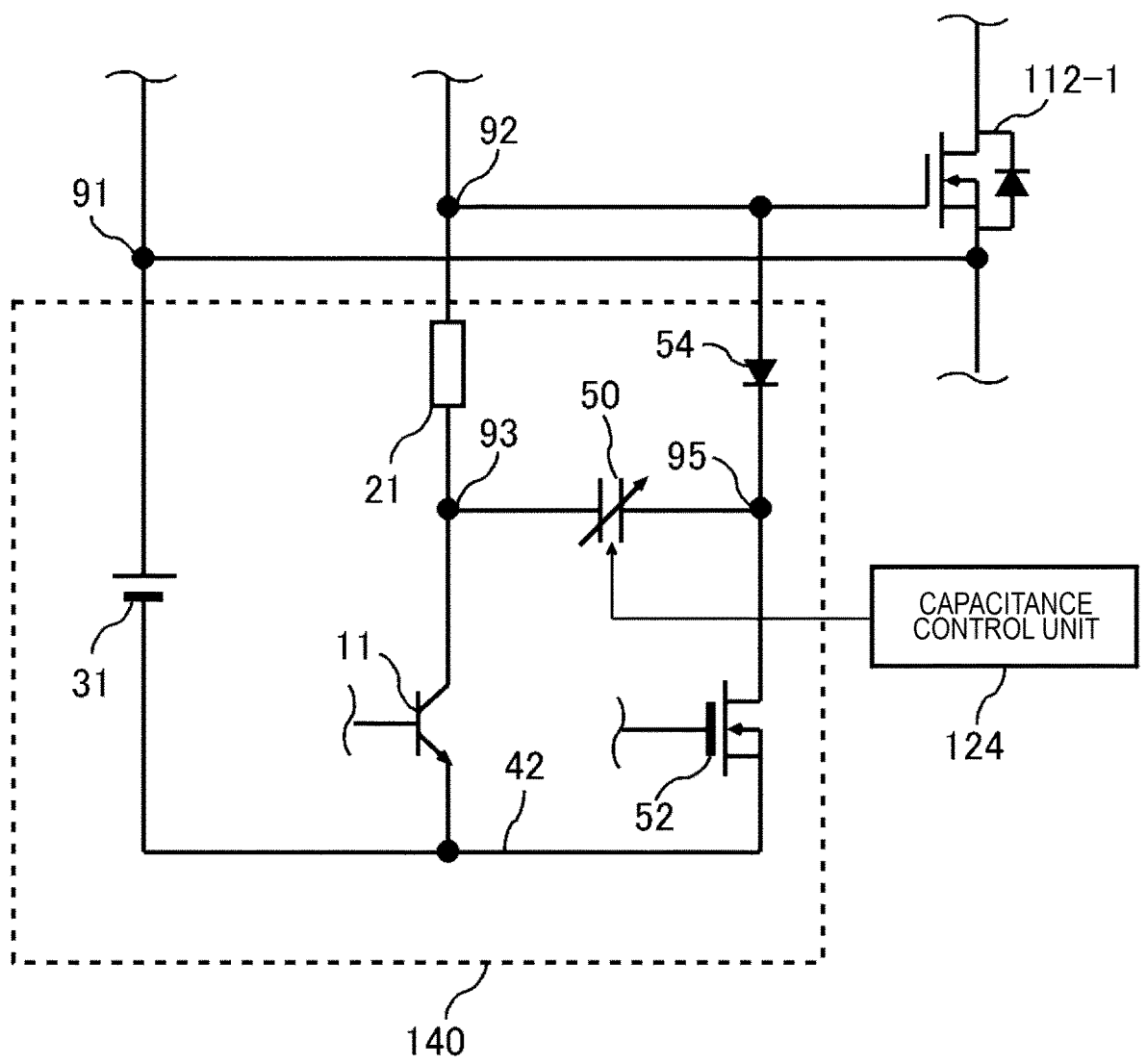
FIG. 7 shows another configuration example of the reference-potential-side circuit 140.

FIG. 7 shows another configuration example of the reference-potential-side circuit 140. With respect to the configuration of any of the reference-potential-side circuits 140 described above by referring to FIG. 2-6, the capacitance of the first capacitor 50 of the reference-potential-side circuit 140 in this example is variable. The driving apparatus 110 may include a capacitance control unit 124 for controlling the capacitance of the first capacitor 50. The configuration other than the first capacitor 50 and the capacitance control unit 124 is similar to that of any of the examples described above by referring to FIG. 2-6.

The capacitance control unit 124 may adjust the capacitance of the first capacitor 50 such that the period t1-t3 indicated in FIG. 3 approaches 0. This adjustment can bring forward the timing t3 at which the gate voltage Vgs falls below the plateau voltage, thereby shorting the turn-off time of the switching device 112.

For example, increasing the capacitance of the first capacitor 50 can allow more gate charge to move to the first capacitor 50. During the period t2-t3, gate charge that did not move to the first capacitor 50 is discharged via the first resistor element 21. Hence, the period t2-t3 can be shortened by increasing the capacitance of the first capacitor 50. However, excessively increasing the capacitance of the first capacitor 50 will cause a large gate current Ig to flow even after the voltage Vds across the main terminals rises, leading to a large surge voltage.

The capacitance control unit 124 may adjust the capacitance of the first capacitor 50 to the extent that the surge voltage does not increase. The capacitance control unit 124 may adjust the capacitance of the first capacitor 50 by using operation information of the circuit (e.g., gate voltage Vgs, gate current Ig, voltage Vds across the main terminals, main current Id, and capacitor voltage Vc) and/or control information of an element to be driven (e.g., on time or off time of the element to be driven, signal input from the control circuit 114 to the driving apparatus 110). The capacitance of the first capacitor 50 may be adjusted to shorten the period t2-t3.

Figure 8:
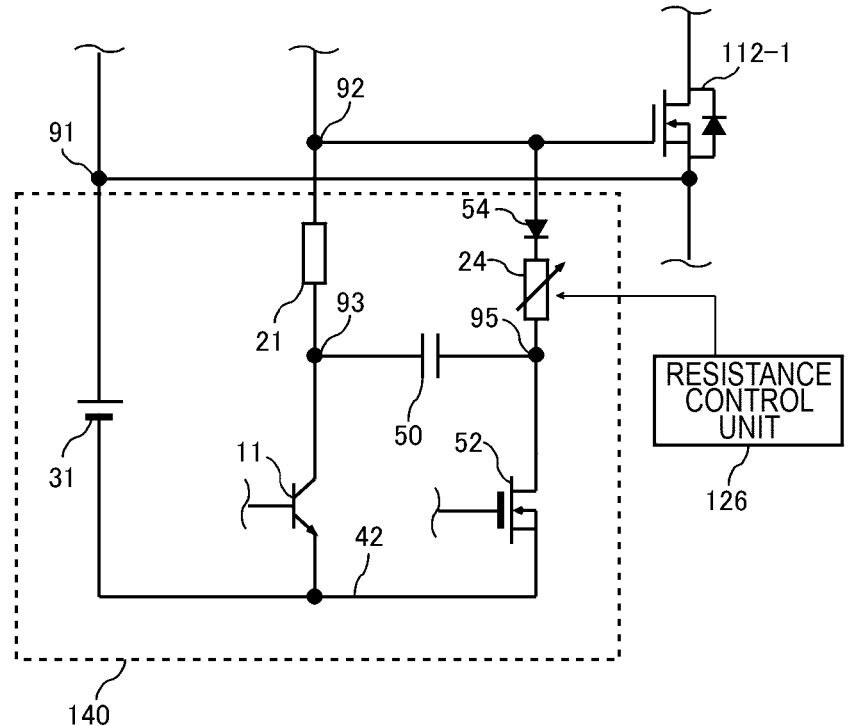
FIG. 8 shows another configuration example of the reference-potential-side circuit 140.

FIG. 8 shows another configuration example of the reference-potential-side circuit 140. With respect to the configuration of the reference-potential-side circuit 140 shown in FIG. 4, the resistance value of the second resistor element 24 of the reference-potential-side circuit 140 in this example is variable. The driving apparatus 110 may include a resistance control unit 126 for controlling the resistance value of the second resistor element 24. The configuration other than the second resistor element 24 and the resistance control unit 126 is similar to that of the example described above by referring to FIG. 4.

In this example, a current that flows through the first diode 54 can be adjusted. The resistance value of the second resistor element 24 may be adjusted to adjust a current that flows from the control terminal of the switching device 112 to the first capacitor 50 and a current that flows from the control terminal of the switching device 112 via the first discharge control unit 52 to the reference potential line 42. The resistance control unit 126 may adjust the resistance value of the second resistor element 24 such that a flowing current through the first diode 54 is equal to or lower than a limiting value.

Figure 9:
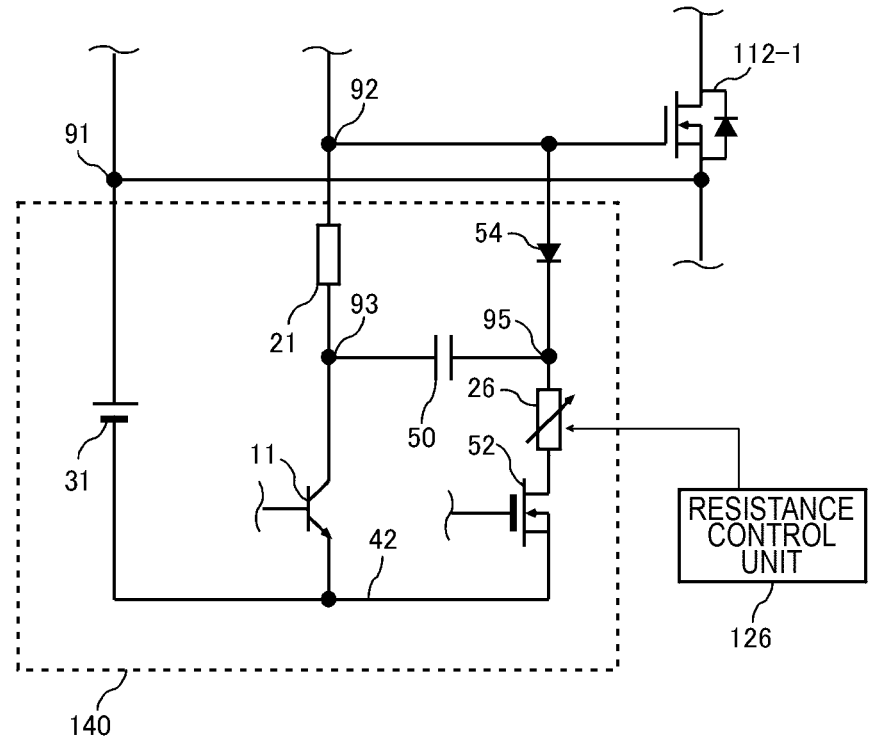
FIG. 9 shows another configuration example of the reference-potential-side circuit 140.

FIG. 9 shows another configuration example of the reference-potential-side circuit 140. With respect to the configuration of the reference-potential-side circuit 140 shown in FIG. 5, the resistance value of the third resistor element 26 of the reference-potential-side circuit 140 in this example is variable. The driving apparatus 110 may include a resistance control unit 126 for controlling the resistance value of the third resistor element 26. The configuration other than the third resistor element 26 and the resistance control unit 126 is similar to that of the example described above by referring to FIG. 5.

In this example, a current that flows through the first discharge control unit 52 can be adjusted. The resistance value of the third resistor element 26 may be adjusted to adjust a current that flows from the first capacitor 50 to the reference potential line 42 and a current that flows from the switching device 112 via the third resistor element 26 to the reference potential line 42. The resistance control unit 126 may adjust the resistance value of the third resistor element 26 such that a flowing current through the first diode 54 is equal to or lower than a limiting value.

Figure 10:
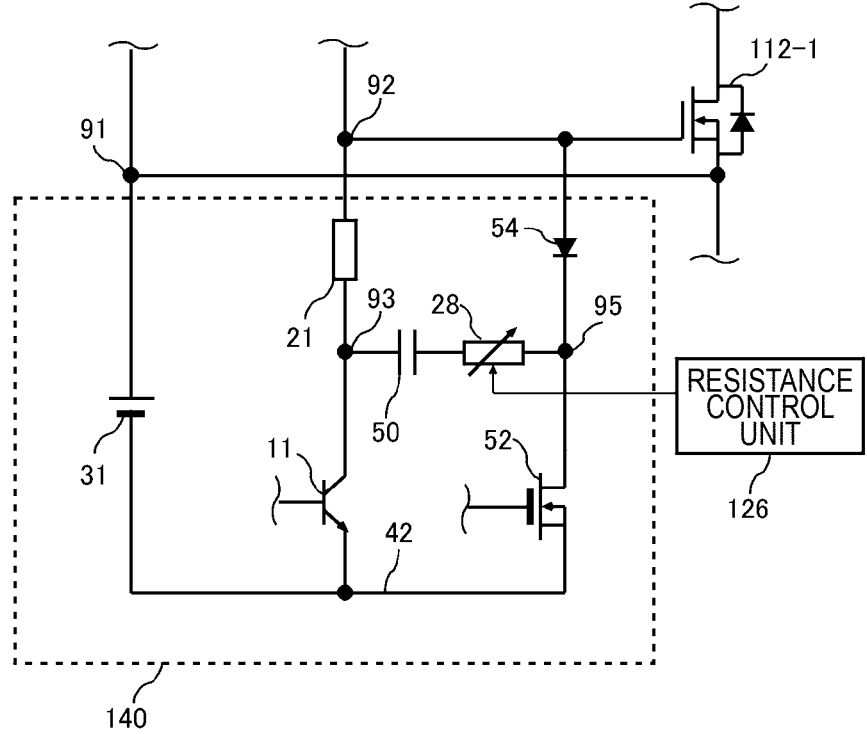
FIG. 10 shows another configuration example of the reference-potential-side circuit 140.

FIG. 10 shows another configuration example of the reference-potential-side circuit 140. With respect to the configuration of the reference-potential-side circuit 140 shown in FIG. 6, the resistance value of the fourth resistor element 28 of the reference-potential-side circuit 140 in this example is variable. The driving apparatus 110 may include a resistance control unit 126 for controlling the resistance value of the fourth resistor element 28. The configuration other than the fourth resistor element 28 and the resistance control unit 126 is similar to that of the example described above by referring to FIG. 6.

In this example, a current that flows through the first capacitor 50 can be adjusted. The resistance value of the fourth resistor element 28 may be adjusted to adjust a current that flows from the control terminal of the switching device 112 to the first capacitor 50 and a current that flows from the first capacitor 50 to the reference potential line 42. The resistance control unit 126 may adjust the resistance value of the fourth resistor element 28 such that a flowing current through the first diode 54 is equal to or lower than a limiting value.

The resistance control unit 126 described above by referring to FIG. 8-10 may control one or more resistors among the second resistor element 24, the third resistor element 26, and the fourth resistor element 28. The resistance control unit 126 may control the resistance value of the first resistor element 21. In this case, the slope of the gate voltage Vgs in the period t3-t4 indicated in FIG. 3 can be adjusted.

Figure 11:
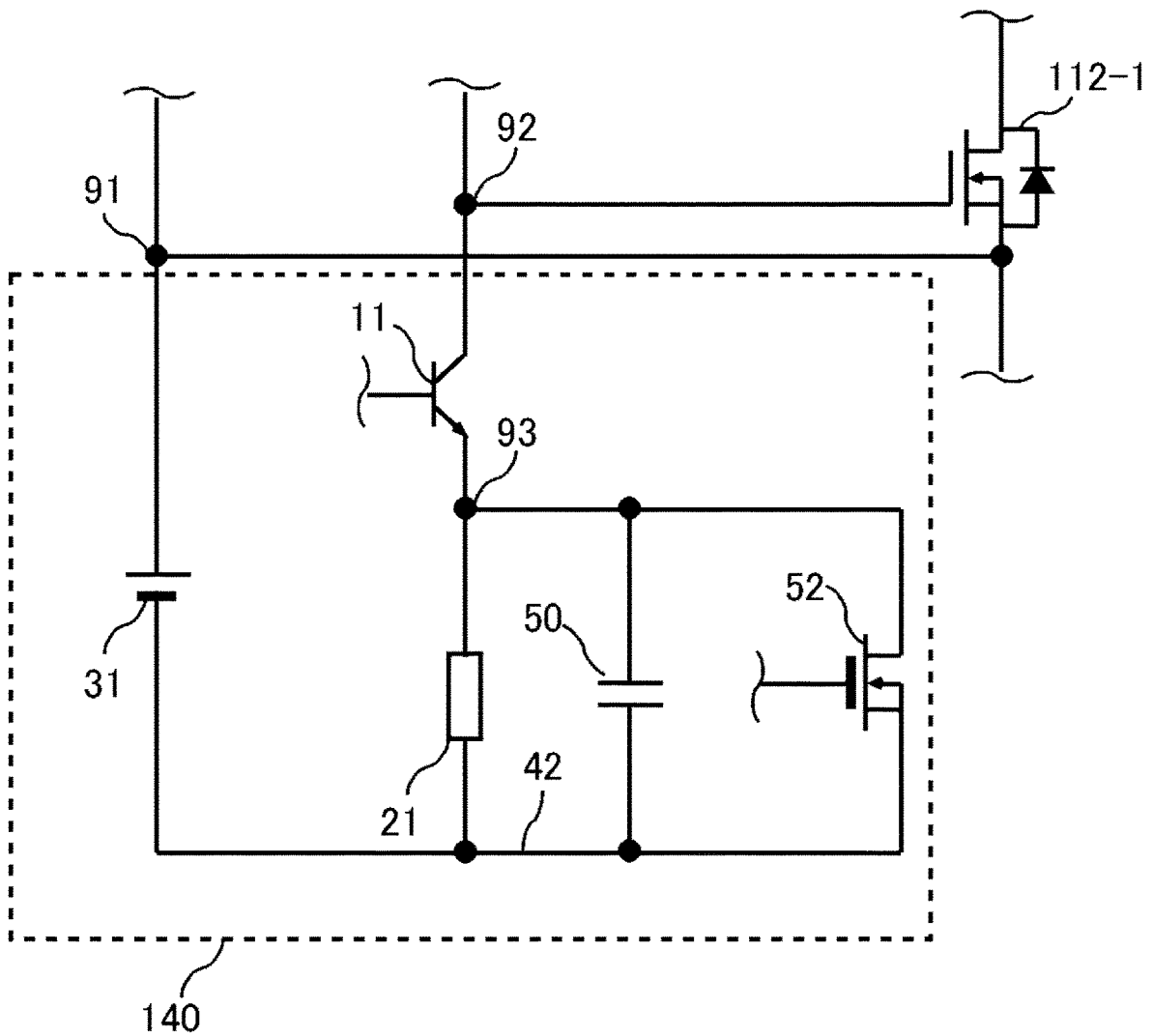
FIG. 11 shows another configuration example of the reference-potential-side circuit 140.

FIG. 11 shows another configuration example of the reference-potential-side circuit 140. The reference-potential-side circuit 140 in this example includes a first discharge control unit 52 in addition to the configuration of the reference-potential-side circuit 240 shown in FIG. 1. The first discharge control unit 52 in this example also controls whether to discharge the first capacitor 50. The first discharge control unit 52 discharges the first capacitor 50 at similar timings to the examples described above by referring to FIG. 2-10.

The first discharge control unit 52 in this example is provided in parallel with the first capacitor 50. The first discharge control unit 52 in this example is a transistor for controlling whether to connect two electrodes of the first capacitor 50. However, the configuration of the first discharge control unit 52 is not limited to this. The first discharge control unit 52 may discharge the first capacitor 50 at any timing independently of the first switching control unit 11. Also in this example, the surge voltage can be suppressed, the turn-off time can be shortened, and the first capacitor 50 can be discharged fast.

Figure 12:
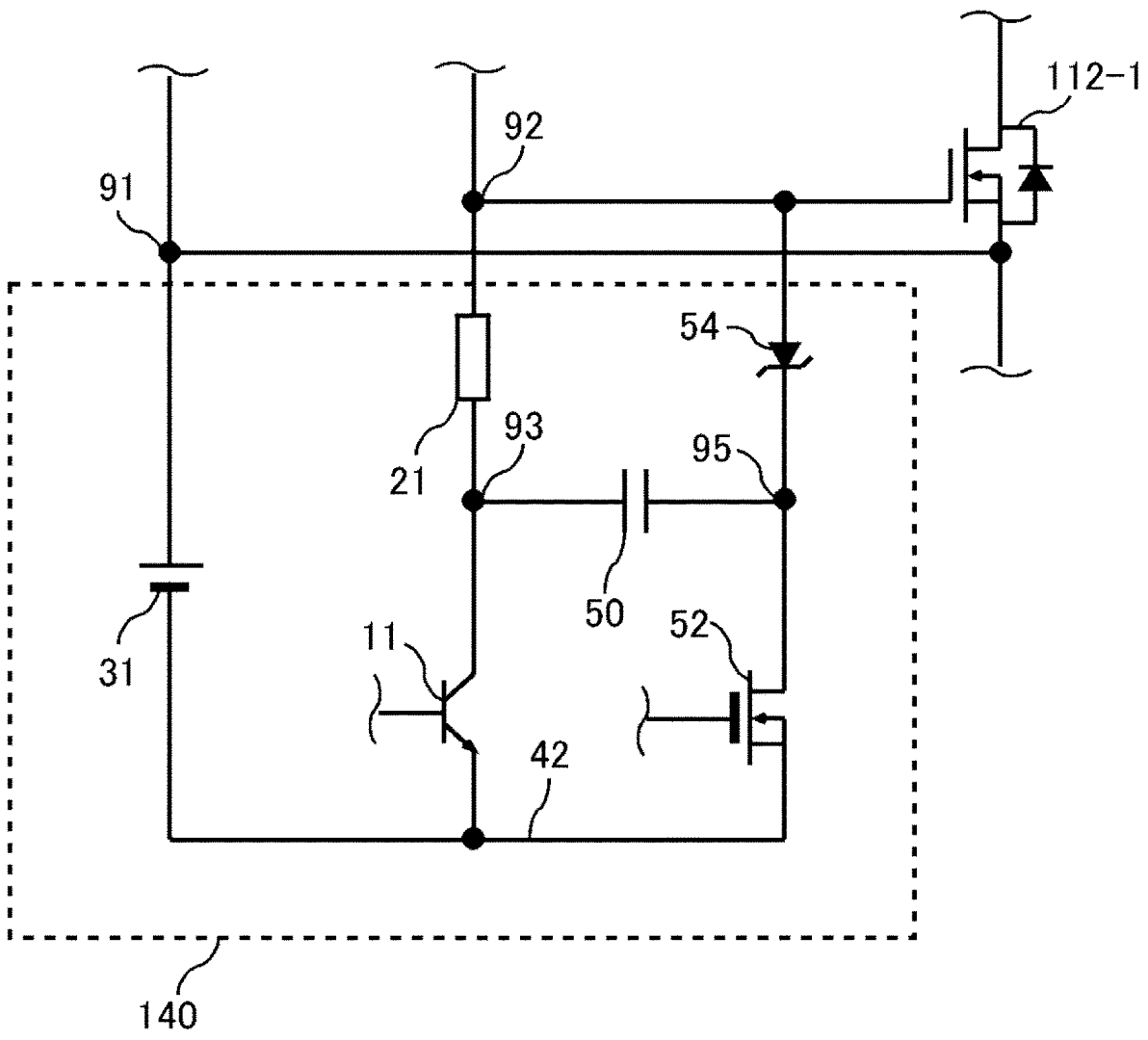
FIG. 12 shows another configuration example of the reference-potential-side circuit 140.

FIG. 12 shows another configuration example of the reference-potential-side circuit 140. With respect to any of the reference-potential-side circuits 140 described above by referring to FIG. 2-10, the first diode 54 of the reference-potential-side circuit 140 in this example is a Zener diode. The structure other than the first diode 54 is similar to that of any of the examples described above by referring to FIG. 2-10. In this example, the gate voltage Vgs can be suppressed from being varied in the negative direction while the switching device 112 is turned off.

Switching the other switching device 112-2 into the on or off state while the switching device 112-1 is turned off may cause the gate voltage Vgs of the switching device 112-1 to be varied in the positive or negative direction. If the gate voltage Vgs is varied in the negative direction, an insulation breakdown may occur between the gate and the source. If the gate voltage Vgs is varied in the positive direction, the switching device 112-1 may accidentally transitions to the on state, leading to a shorted state in which the switching devices 112-1 and 112-2 are both turned on.

As described above by referring to FIG. 2 and the like, the first discharge control unit 52 functions as an active mirror clamp circuit, so that the switching device 112-1 can be prevented from accidentally transitioning to the on state. Meanwhile, forming the first diode 54 from a Zener diode allows the gate voltage Vgs to be suppressed from being varied in the negative direction.

Figure 13:
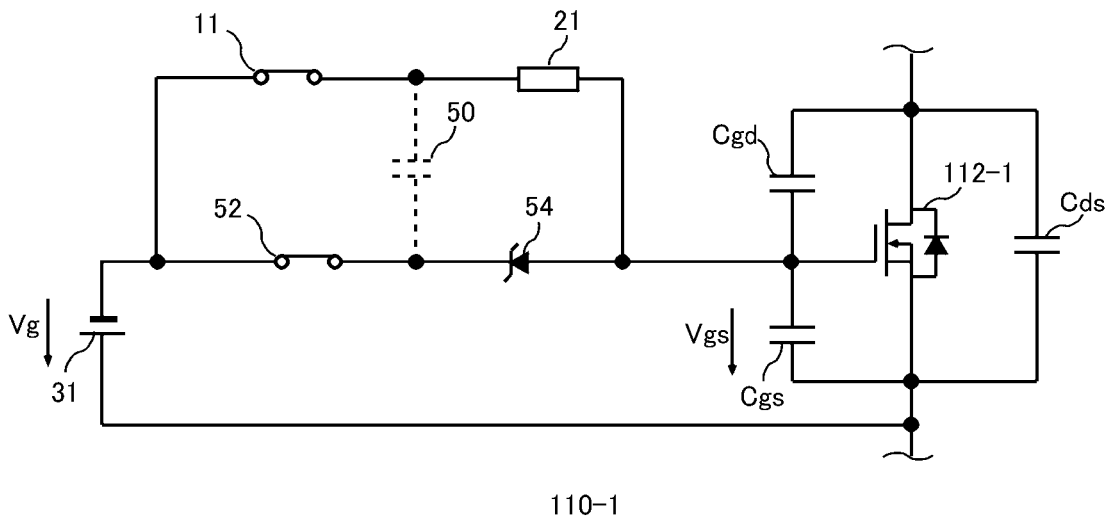
FIG. 13 shows an equivalent circuit to the reference-potential-side circuit 140 and the switching device 112-1 shown in FIG. 12.

FIG. 13 shows an equivalent circuit to the reference-potential-side circuit 140 and the switching device 112-1 shown in FIG. 12. FIG. 13 indicates capacitances Cgd, Cds, and Cgs between terminals of the switching device 112-1. FIG. 13 depicts an equivalent circuit implemented when the switching device 112 transitions to the off state and is in a steady state. The first switching control unit 11 and the first discharge control unit 52 are both in the on state. In this case, the first capacitor 50 is in a shorted state in which the electrodes at both ends thereof are connected, so the first capacitor 50 is not considered in the equivalent circuit in FIG. 13. During the steady state, a gate voltage Vgs of the capacitance Cgs is almost equal to a voltage Vg generated by the first power source 31.

During this state, when the gate voltage Vgs increases in the negative direction upon the other switching device 112-2 being switched, a voltage of (Vgs-Vg) corresponding to the degree of variation is applied to the first diode 54. A similar voltage of (Vgs-Vg) is also applied to the first resistor element 21.

When the voltage of (Vgs-Vg) exceeds the breakdown voltage of the first diode 54, the first diode 54 is turned on, and the first power source 31 and the capacitance Cgs are connected in parallel. In this case, a voltage applied to the first resistor element 21 decreases to 0 V. In the meantime, the breakdown voltage of the first diode 54 is preferably designed such that the gate voltage Vgs does not exceed a gate-source withstand voltage.

The first power source 31 and the capacitance Cgs are connected in parallel, so the gate voltage Vgs is equal to the voltage Vg. This allows the gate voltage Vgs to be prevented from excessively increasing in the negative direction.

Figure 14:
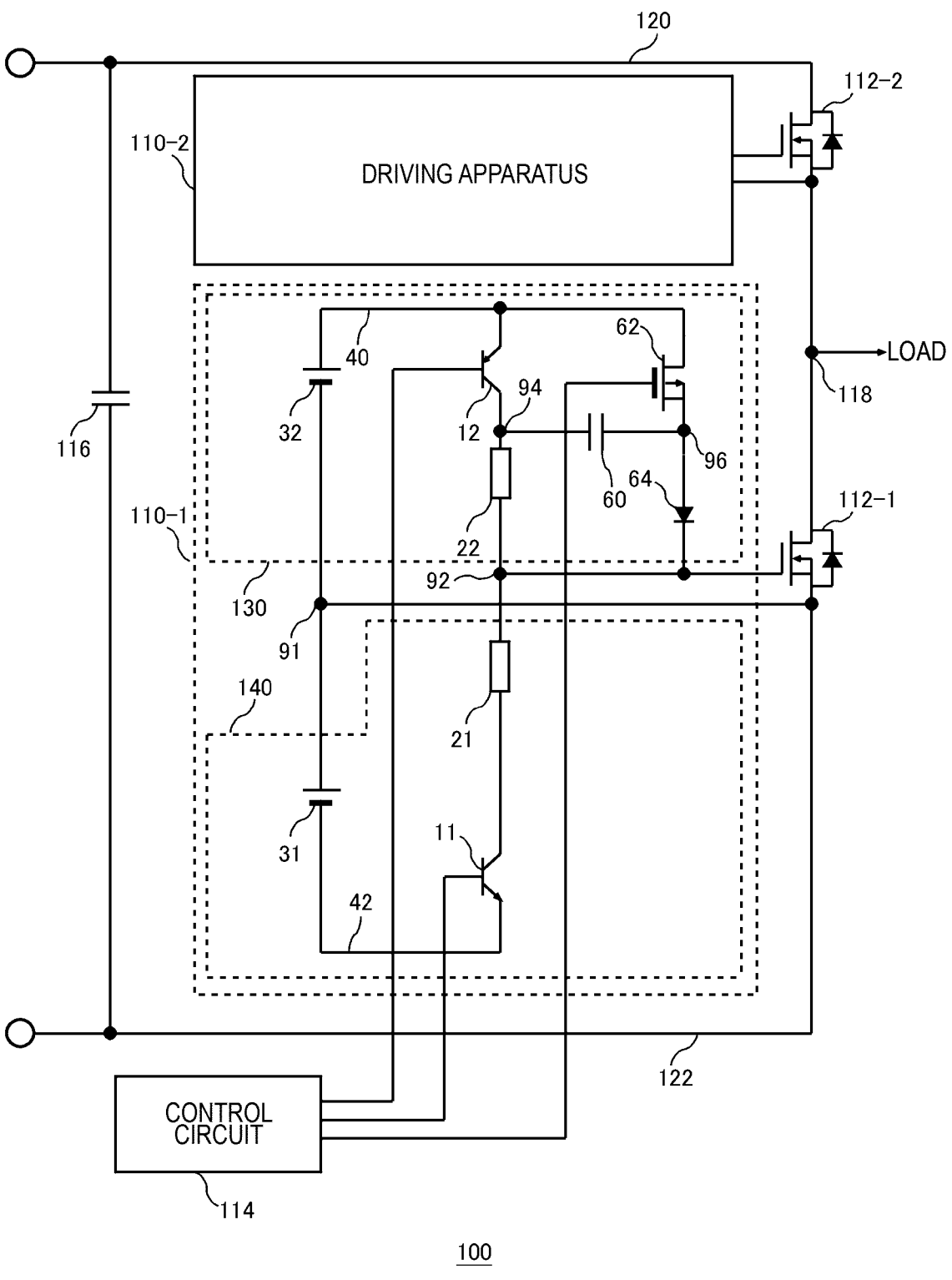
FIG. 14 shows a configuration example of a power delivery circuit 100 according to one embodiment of the present invention.

FIG. 14 shows a configuration example of a power delivery circuit 100 according to one embodiment of the present invention. The driving apparatus 110 in this example is different from the example of FIG. 2 in terms of the configurations of the reference-potential-side circuit 140 and the high-potential-side circuit 130. While the driving apparatus 110 shown in FIG. 2 is intended to shorten the turn-off time, the driving apparatus 110 in this example is intended to shorten the turn-on time.

The reference-potential-side circuit 140 in this example includes a first power source 31, a first switching control unit 11, and a first resistor element 21. The functions of the respective components are similar to those in FIG. 2. However, the driving apparatus 110 may include any of the reference-potential-side circuits 140 described above by referring to FIG. 2-13. In this case, the driving apparatus 110 can shorten both the turn-off time and the turn-on time.

The high-potential-side circuit 130 in this example includes a second capacitor 60 and a second discharge control unit 62 in addition to the configuration of the high-potential-side circuit 130 shown in FIG. 2. The second capacitor 60 is an example of a high-potential-side capacitor. The second discharge control unit 62 is an example of a high-potential-side discharge control unit. The second capacitor 60 is provided in parallel with the first resistor element 22 on a path from the control terminal of the switching device 112 to the high potential line 40. The second capacitor 60 in this example is disposed in parallel with the first resistor element 22 between the control terminal of the switching device 112 and the second switching control unit 12 (or connection point 94). The connection point 94 is a connection point between the first resistor element 22 and the second switching control unit 12.

The second discharge control unit 62 is provided separately from the second switching control unit 12. The second discharge control unit 62 in this example is a high-potential-side switch for performing switching as to whether to connect an electrode of the second capacitor 60 on the switching-device-112 side to the high potential line 40. The high-potential-side switch may be a transistor device, a photocoupler, a digital isolator, a mechanical relay, or a photodiode, or may be another switch device. In accordance with an input control signal, these devices perform switching as to whether to connect the electrode of the second capacitor 60 on the switching-device-112 side to the high potential line 40. Using an insulating transmission element such as a photocoupler allows the electrical insulation described above to be attained with a simple design and a small circuit scale. The transistor device may be a semiconductor element formed on a silicon substrate or a semiconductor element formed on a compound semiconductor substrate of, for example, GaN. A similar structure to the example described for the second discharge control unit 62 may be applied to the first discharge control unit 52. When the second switching control unit 12 is in the on state and the second discharge control unit 62 is in the on state, both ends of the second capacitor 60 are connected to the high potential line 40. This allows the second capacitor 60 to be discharged without the intervention of the first resistor element 22. Note that the on resistance of the second switching control unit 12 and the second discharge control unit 62 is sufficiently lower than that of the first resistor element 22.

The second discharge control unit 62 is placed into the on state after a timing at which the second switching control unit 12 is placed into the on state. Thus, for a predetermined period after the second switching control unit 12 is placed into the on state, gate charge is delivered to the switching device 112 via the second capacitor 60, thereby immediately increasing the gate voltage. Accordingly, the turn-on time of the switching device 112 can be shortened. Placing the second discharge control unit 62 in the on state causes the accumulated charge in the second capacitor 60 to be discharged without the intervention of the first resistor element 22. Hence, the accumulated charge in the second capacitor 60 can be immediately discharged, and even when the switching device 112 performs a high-speed operation, the second capacitor 60 can be sufficiently discharged. In addition, the surge voltage can be suppressed by adjusting the resistance value of the first resistor element 22.

The control circuit 114 may control the on/off state of the second discharge control unit 62. The control circuit 114 may control the second discharge control unit 62 on the basis of a timing at which the second switching control unit 12 is placed into the on state. For example, the second discharge control unit 62 may be placed into the on state when a predetermined period of time has elapsed after the second switching control unit 12 was placed into the on state. The control circuit 114 may control the second discharge control unit 62 on the basis of the state of any of the driving apparatuses 110-1 and 110-2 and the switching devices 112-1 and 112-2. Note that the state of each apparatus and element may be an instantaneous value or time waveform of a voltage or current at a predetermined position on a circuit.

The high-potential-side circuit 130 may further include a second diode 64. The second diode 64 is an example of a high-potential-side diode. The second diode 64 is disposed in parallel with the first resistor element 22 between the control terminal of the switching device 112 and the second capacitor 60. The second diode 64 is disposed such that a direction from the switching device 112 toward the second capacitor 60 is a reverse blocking direction. Providing the second diode 64 prevents the accumulated charge in the second capacitor 60 from being discharged via the first resistor element 22. The second discharge control unit 62 in this example is disposed between the high potential line 40 and a connection point 96 between the second diode 64 and the second capacitor 60.

Figure 15:
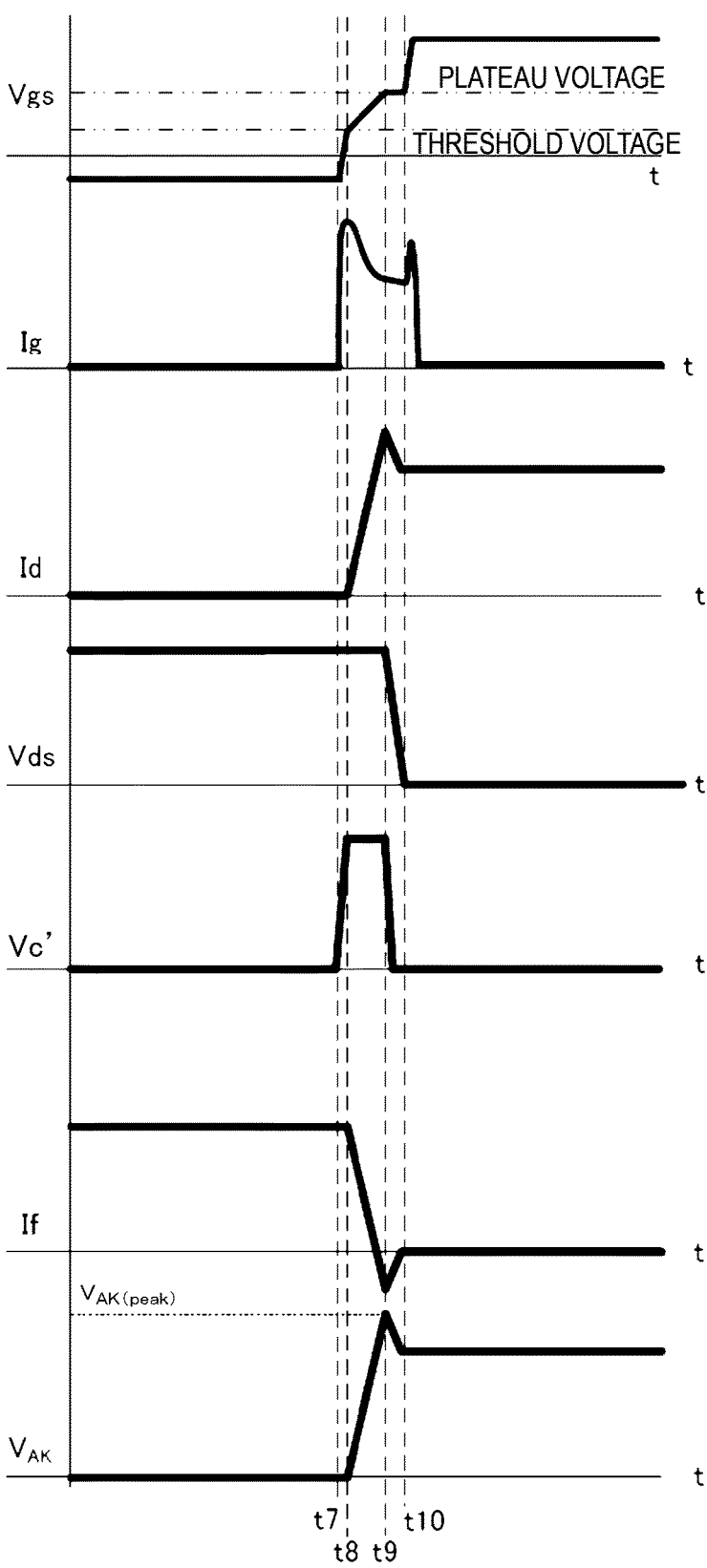
FIG. 15 shows operation examples of the switching device 112-1 and a high-potential-side circuit 130.

FIG. 15 shows examples of turn-on operations of the switching device 112-1 and the high-potential-side circuit 130. The horizontal axes in FIG. 15 indicate time, and the vertical axes therein indicate the magnitude of voltage or current. Vgs indicate the gate voltage (gate-source voltage) of the switching device 112-1, Ig indicates the gate current thereof, Vds indicates the voltage across the main terminals thereof, Id indicates the main current thereof, and Vc' indicates a second capacitor voltage. FIG. 15 also indicates the waveform of a freewheeling current If that flows through a freewheeling diode of the switching device 112-2, and the waveform of an anode-cathode voltage $V_{AK}$ of the freewheeling diode. FIG. 15 indicates operations of the example of FIG. 14.

With respect to an initial state in FIG. 15, the switching device 112-1 is in the off state. At a timing t7, the second switching control unit 12 transitions from the off state to the on state. Thus, the gate current Ig flows, thereby delivering charge to the gate of the switching device 112-1 via the second capacitor 60. The gate voltage Vgs immediately increases, and the second capacitor voltage Vc' increases. FIG. 15 is based on the assumption that the gate current Ig which flows into the control terminal of the switching device 112-1 is positive and that the gate current which flows out of the control terminal of the switching device 112-1 is negative. Charge is delivered to the control terminal of the switching device 112-1 via the second capacitor 60 until the gate voltage Vgs reaches a threshold voltage Vth of the switching device 112-1. The threshold voltage Vth may be the same as the first threshold voltage described above. The second capacitor 60 may have a capacitance such that the gate charge can be delivered to match the gate voltage Vgs of the switching device 112-1 with the threshold voltage Vth, or may have a capacitance such that the gate charge can be delivered until the gate voltage Vgs of the switching device 112-1 becomes no less than the threshold voltage Vth.

At the moment at which the gate voltage Vgs has increased to the threshold voltage Vth and after this moment (at time t8 and thereafter in FIG. 15), the gate current Ig flows from the high potential line 40 to the switching device 112-1 through the first resistor element 22 and the second switching control unit 12. The gate current Ig becomes relatively small according to the resistance value of the first resistor element 22. The switching device 112-1 starts to be turned on, so the main current Id flowing through the drain terminal gradually increases.

In this example, during a period from the moment at which the gate voltage Vgs increases to the threshold voltage Vth to the moment at which the gate voltage Vgs reaches a plateau voltage (t8-t9 in FIG. 15), i.e., a period in which the time rate of change (di/dt) in the main current Id, which affects the magnitude of the surge voltage, is set according to the gate current Ig, the gate current Ig can be adjusted by the first resistor element 22 so that the surge voltage can be adjusted.

When the main current Id increases upon the switching device 112-1 being turned on, the freewheeling current If flowing through the switching device 112-2 decreases. The larger the time change di/dt in the main current Id flowing through the switching device 112-1 is, the larger the time change in the freewheeling current If is, and the larger a reverse-recovery surge voltage $V_{AK(peak)}$ on the switching device 112-2 is. At a period t8 and thereafter, in this example, the gate current flows via the first resistor element 22, so that the time change di/dt in the main current Id can be prevented from becoming excessively large. Hence, the reverse-recovery surge voltage $V_{AK(peak)}$ can be suppressed. Before the period t8, the gate current flows via the second capacitor 60 without passing the first resistor element 22, so that the gate voltage Vgs of the switching device 112-1 can be immediately raised to the threshold voltage Vth. Hence, both a reduction in turn-on loss and suppression of the reverse-recovery surge can be attained.

In the examples of FIGS. 14 and 15, the second discharge control unit 62 discharges the second capacitor 60 at a timing t9 or at a predetermined timing t10 after the timing t9. In the example of FIG. 15, with the condition that the gate voltage Vgs is equal to or higher than the plateau voltage, the second discharge control unit 62 is placed into the on state and discharges the second capacitor 60. The second discharge control unit 62 may be placed into the on state at a timing at which the gate voltage Vgs reaches the plateau voltage or after a timing at which the gate voltage Vgs reaches the plateau voltage. Thus, the capacitor voltage Vc' of the second capacitor 60 immediately decreases, so, as in the examples described so far, even when the switching device 112 performs a high-speed operation, the second capacitor 60 can be sufficiently discharged. The gate current Ig of the switching device 112 flows from the high potential line 40 through the second discharge control unit 62 toward the control terminal. Hence, the gate voltage Vgs can also immediately increase. Although placing the second discharge control unit 62 into the on state at the timing t10 increases the gate current Ig, this does not affect the magnitude of a reverse-recovery surge voltage generated at the timing t9.

As indicated above, as with the examples of FIGS. 2 and 3, the examples shown in FIGS. 14 and 15 allow for providing the driving apparatus 110 that can address an increase in the operating frequency of the switching device 112 while attaining both suppression of the reverse-recovery surge voltage of the switching device 112 and shortening of the turn-on time thereof.

In the examples shown in FIGS. 14 and 15, accordingly, discharge of the second capacitor 60 needs to be completed, at the latest, by the start of the next turning-on of the switching device 112. The second discharge control unit 62 may discharge the second capacitor 60 during the period from the completion of turning-on of the switching device 112 to the start of the next turning-off of the switching device 112. The second discharge control unit 62 may discharge the second capacitor 60 during a dead time period of the pair of switching devices 112-1 and 112-2, which are operated in a complementary manner.

The control circuit 114 may control the second discharge control unit 62 on the basis of at least one of the gate voltage Vgs, the gate current Ig, the voltage Vds across the main terminals, or the main current Id. On the basis of at least one of these values, the control circuit 114 may estimate the timing t9, at which the gate voltage Vgs starts to be larger than the plateau voltage. For example, the control circuit 114 may detect, as t9, a timing at which the voltage Vds across the main terminals of a switching device performing a reverse recovery operation among the pair of switching devices 112-1 and 112-2 operated in a complementary manner (for example, the switching device 112-1 may perform the reverse recovery operation when the switching device 112-2 performs the turn-on operation) indicates a peak, or a timing at which the main current Id reaches a steady state value. The control circuit 114 may control the second discharge control unit 62 so as to place the same into the on state at a predetermined timing after the timing t9.

Figure 16:
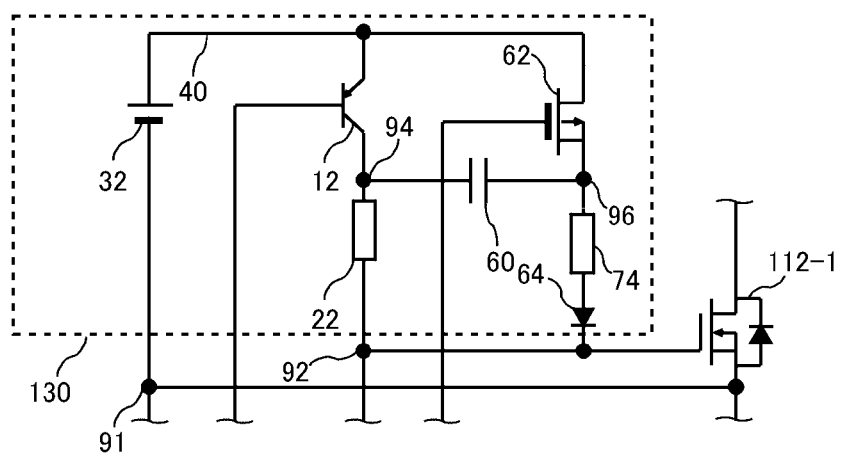
FIG. 16 shows another configuration example of the high-potential-side circuit 130.

FIG. 16 shows another configuration example of the high-potential-side circuit 130. In addition to the configuration of the high-potential-side circuit 130 described above by referring to FIG. 14, the high-potential-side circuit 130 in this example includes a second resistor element 74 on the high-potential side. The second resistor element 74 is disposed in series with the second diode 64 between the control terminal of the switching device 112 and a connection point 96 between the second capacitor 60 and the second discharge control unit 62. In the example of FIG. 16, the second resistor element 74 is disposed between the second diode 64 and the connection point 96. In another example, however, the second resistor element 74 may be disposed between the second diode 64 and the control terminal of the switching device 112. Disposing the second resistor element 74 in such a manner allows a current flowing through the second diode 64 to be equal to or lower than a limiting value of the second diode 64 without decreasing the discharge rate of the second capacitor 60.

The second resistor element 74 may be provided to adjust a current that flows through the second diode 64. For example, the second resistor element 74 may be provided to prevent a current exceeding a rating from flowing through the second diode 64. To shorten the turn-off time, the resistance value of the second resistor element 74 is preferably lower than the resistance value of the first resistor element 22.

Figure 17:
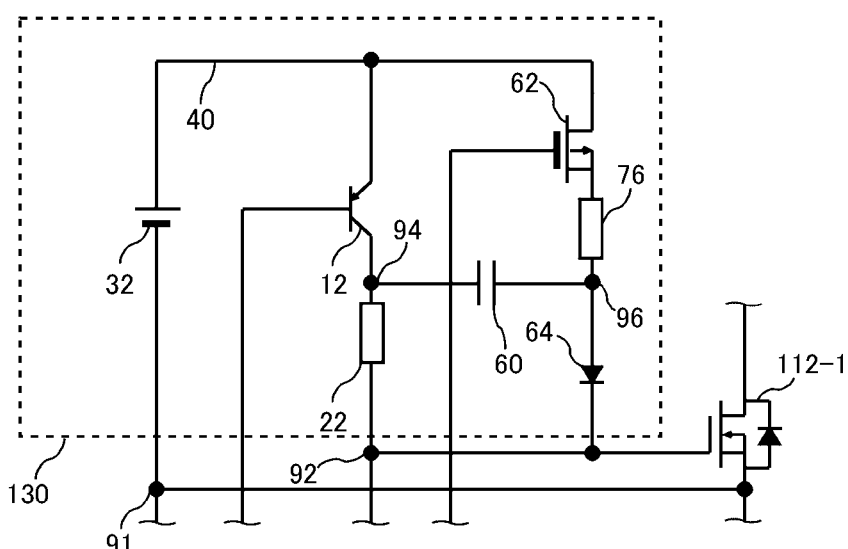
FIG. 17 shows another configuration example of the high-potential-side circuit 130.

FIG. 17 shows another configuration example of the high-potential-side circuit 130. In addition to the configuration of any of the high-potential-side circuits 130 described above by referring to FIG. 14-16, the highpotential-side circuit 130 in this example includes a third resistor element 76 on the high-potential side. As shown in FIG. 16, the high-potential-side circuit 130 may include the second resistor element 74. The third resistor element 76 is disposed in series with the second discharge control unit 62 between the connection point 96 and the high potential line 40. In the example of FIG. 17, the third resistor element 76 is disposed between the second discharge control unit 62 and the connection point 96. In another example, however, the third resistor element 76 may be disposed between the second discharge control unit 62 and the high potential line 40. Disposing the third resistor element 76 in such a manner allows a current flowing through the second discharge control unit 62 to be equal to or lower than a limiting value of the second discharge control unit 62 without increasing the turn-on time.

The third resistor element 76 may be provided to adjust a current that flows through the second discharge control unit 62. For example, the third resistor element 76 may be provided to prevent a current exceeding a rating from flowing through the second discharge control unit 62. To shorten the turn-on time, the resistance value of the third resistor element 76 is preferably lower than the resistance value of the first resistor element 22.

The resistance value of the third resistor element 76 may be adjusted to adjust a current that flows from the high potential line 40 via the second discharge control unit 62 to the control terminal of the switching device 112. In this way, the time rate of change in the voltage Vds across the main terminals can be adjusted. In addition, the resistance value of the first resistor element 22 may be adjusted to adjust a current that flows from the high potential line 40 through the first resistor element 22 and the second switching control unit 12 to the control terminal of the switching device 112. In this way, the time rate of change in the main current Id can be adjusted. Thus, in this example, the first resistor element 22 and the third resistor element 76 may be separately adjusted to individually adjust the time rate of change in the voltage Vds across the main terminals and the time rate of change in the main current Id. Accordingly, the switching speed can be increased without increasing the surge voltage, so that switching loss can be reduced.

Figure 18:
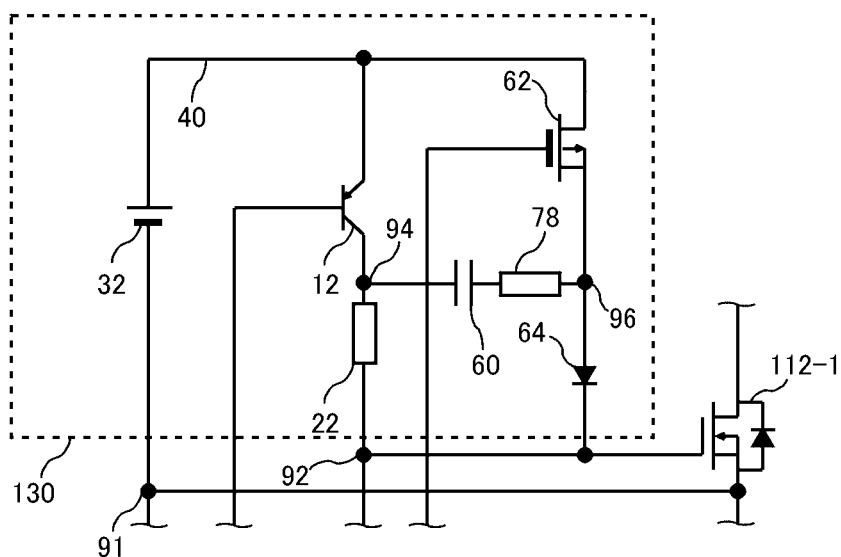
FIG. 18 shows another configuration example of the high-potential-side circuit 130.

FIG. 18 shows another configuration example of the high-potential-side circuit 130. In addition to the configuration of any of the high-potential-side circuits 130 described above by referring to FIG. 14-17, the high-potential-side circuit 130 in this example includes a fourth resistor element 78 on the high-potential side. As shown in FIGS. 16 and 17, the high-potential-side circuit 130 may include at least one of the second resistor element 74 or the third resistor element 76. The fourth resistor element 78 is disposed in series with the second capacitor 60 between the connection points 94 and 96. In the example of FIG. 18, the fourth resistor element 78 is disposed between the connection point 94 and the second capacitor 60. In another example, however, the fourth resistor element 78 may be disposed between the connection point 96 and the second capacitor 60. Disposing the fourth resistor element 78 in such a manner allows a current flowing through the second capacitor 60 to be equal to or lower than a limiting value of the second capacitor 60 without decreasing the effect of shortening the turn-off time achieved by the second discharge control unit 62.

The fourth resistor element 78 may be provided to adjust a current that flows through the second capacitor 60. For example, the fourth resistor element 78 may be provided to prevent a current exceeding a rating from flowing through the second capacitor 60 or the second diode 64. To shorten the turn-on time, the resistance value of the fourth resistor element 78 is preferably lower than the resistance value of the first resistor element 22.

The resistance value of the fourth resistor element 78 may be adjusted to adjust a current that flows from the control terminal of the switching device 112 to the second capacitor 60. In this way, the time rate of change in the voltage Vds across the main terminals can be adjusted. In addition, the resistance value of the first resistor element 22 may be adjusted to adjust a current that flows from the high potential line 40 through the first resistor element 22 and the second switching control unit 12 to the control terminal of the switching device 112. In this way, the time rate of change in the main current Id can be adjusted. Thus, in this example, the first resistor element 22 and the fourth resistor element 78 may be separately adjusted to individually adjust the time rate of change in the voltage Vds across the main terminals and the time rate of change in the main current Id. Accordingly, the switching speed can be increased without increasing the surge voltage, so that switching loss can be reduced.

Figure 19:
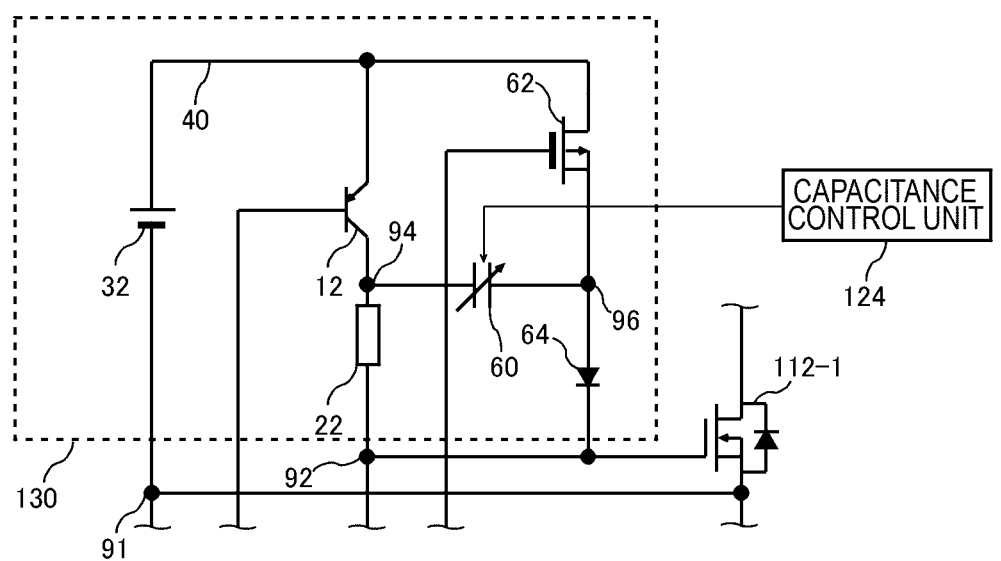
FIG. 19 shows another configuration example of the high-potential-side circuit 130.

FIG. 19 shows another configuration example of the high-potential-side circuit 130. With respect to the configuration of any of the high-potential-side circuits 130 described above by referring to FIG. 14-18, the capacitance of the second capacitor 60 of the high-potential-side circuit 130 in this example is variable. The driving apparatus 110 may include a capacitance control unit 124 for controlling the capacitance of the second capacitor 60. The configuration other than the second capacitor 60 and the capacitance control unit 124 is similar to that of any of the examples described above by referring to FIG. 14-18.

The capacitance control unit 124 may adjust the capacitance of the second capacitor 60 such that the period t7-t8 indicated in FIG. 15 approaches 0. This adjustment can bring forward the timing t8 at which the gate voltage Vgs reaches the threshold voltage Vth, thereby shorting the turn-on time of the switching device 112.

For example, increasing the capacitance of the second capacitor 60 can allow more gate charge to move to the control terminal of the switching device 112 via the second capacitor 60. During the period t7-t8, the control terminal of the switching device 112 is charged via the second capacitor 60. Hence, the period t7-t8 can be shortened by increasing the capacitance of the second capacitor 60. However, excessively increasing the capacitance of the second capacitor 60 will cause a large gate current Ig to flow even after the gate voltage Vgs becomes larger than the threshold voltage Vth, leading to a large reverse-recovery surge voltage.

The capacitance control unit 124 may adjust the capacitance of the second capacitor 60 to the extent that the reverse-recovery surge voltage does not increase. The capacitance control unit 124 may adjust the capacitance of the second capacitor 60 by using operation information of the circuit (e.g., gate voltage Vgs, gate current Ig, voltage Vds across the main terminals, main current Id, and second capacitor voltage Vc') and/or control information of an element to be driven (e.g., on time or off time of the element to be driven, signal input from the control circuit 114 to the driving apparatus 110). The capacitance of the second capacitor 60 may be adjusted to shorten the period t7-t8.

Figure 20:
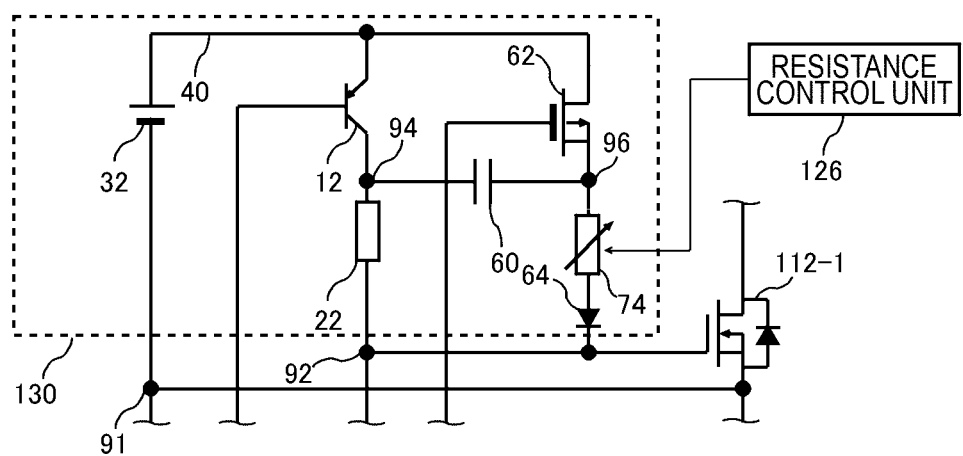
FIG. 20 shows another configuration example of the high-potential-side circuit 130.

FIG. 20 shows another configuration example of the high-potential-side circuit 130. With respect to the configuration of the high-potential-side circuit 130 shown in FIG. 16, the resistance value of the second resistor element 74 of the high-potential-side circuit 130 in this example is variable. The driving apparatus 110 may include a resistance control unit 126 for controlling the resistance value of the second resistor element 74. The configuration other than the second resistor element 74 and the resistance control unit 126 is similar to that of the example described above by referring to FIG. 16.

In this example, a current that flows through the second diode 64 can be adjusted. The resistance value of the second resistor element 74 may be adjusted to adjust a current that flows from the control terminal of the switching device 112 to the second capacitor 60 and a current that flows from the high potential line 40 via the second discharge control unit 62 to the control terminal of the switching device 112. The resistance control unit 126 may adjust the resistance value of the second resistor element 74 such that a flowing current through the second diode 64 is equal to or lower than a limiting value.

Figure 21:
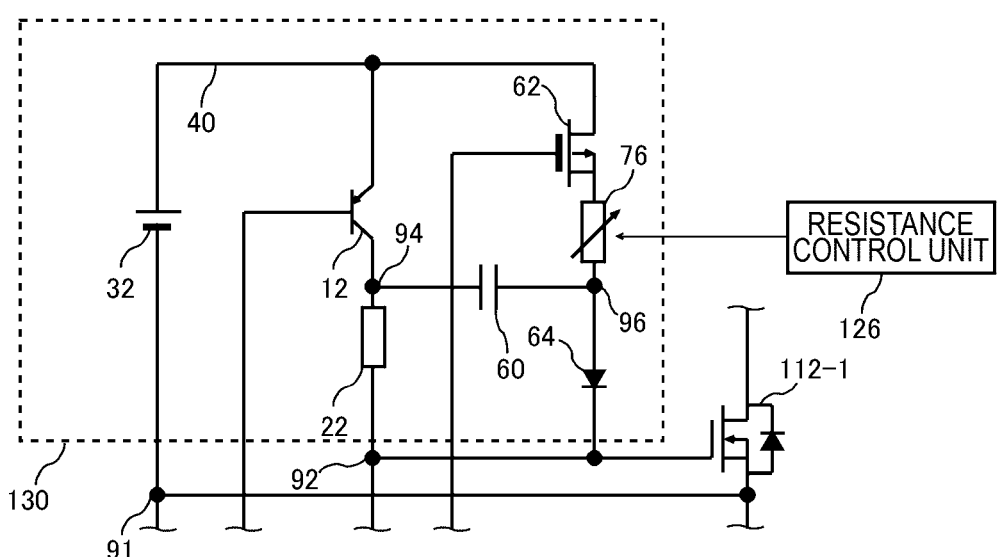
FIG. 21 shows another configuration example of the high-potential-side circuit 130.

FIG. 21 shows another configuration example of the high-potential-side circuit 130. With respect to the configuration of the high-potential-side circuit 130 shown in FIG. 17, the resistance value of the third resistor element 76 of the high-potential-side circuit 130 in this example is variable. The driving apparatus 110 may include a resistance control unit 126 for controlling the resistance value of the third resistor element 76. The configuration other than the third resistor element 76 and the resistance control unit 126 is similar to that of the example described above by referring to FIG. 17.

In this example, a current that flows through the second discharge control unit 62 can be adjusted. The resistance value of the third resistor element 76 may be adjusted to adjust a current that flows from the high potential line 40 to the second capacitor 60 and a current that flows from the third resistor element 76 to the control terminal of the switching device 112. The resistance control unit 126 may adjust the resistance value of the third resistor element 76 such that a flowing current through the second diode 64 is equal to or lower than a limiting value.

Figure 22:
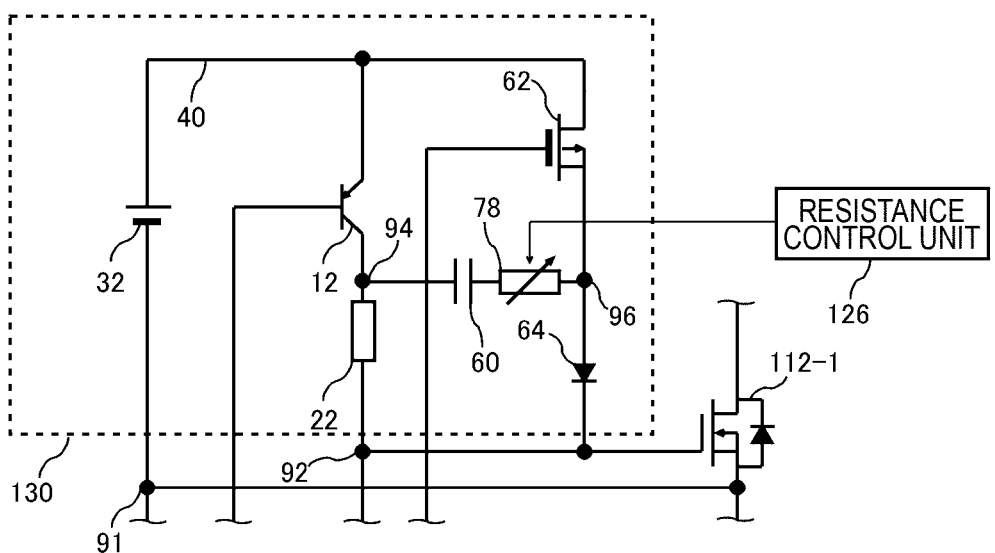
FIG. 22 shows another configuration example of the high-potential-side circuit 130.

FIG. 22 shows another configuration example of the high-potential-side circuit 130. With respect to the configuration of the high-potential-side circuit 130 shown in FIG. 18, the resistance value of the fourth resistor element 78 of the high-potential-side circuit 130 in this example is variable. The driving apparatus 110 may include a resistance control unit 126 for controlling the resistance value of the fourth resistor element 78. The configuration other than the fourth resistor element 78 and the resistance control unit 126 is similar to that of the example described above by referring to FIG. 18.

In this example, a current that flows through the second capacitor 60 can be adjusted. The resistance value of the fourth resistor element 78 may be adjusted to adjust a current that flows from the second capacitor 60 to the high potential line 40 and a current that flows from the second capacitor 60 to the control terminal of the switching device 112. The resistance control unit 126 may adjust the resistance value of the fourth resistor element 78 such that a flowing current through the second diode 64 is equal to or lower than a limiting value.

The resistance control unit 126 described above by referring to FIG. 20-22 may control one or more resistors among the second resistor element 74, the third resistor element 76, and the fourth resistor element 78. The resistance control unit 126 may control the resistance value of the first resistor element 22. In this case, the slope of the gate voltage Vgs in the period t8-t9 indicated in FIG. 15 can be adjusted.

Figure 23:
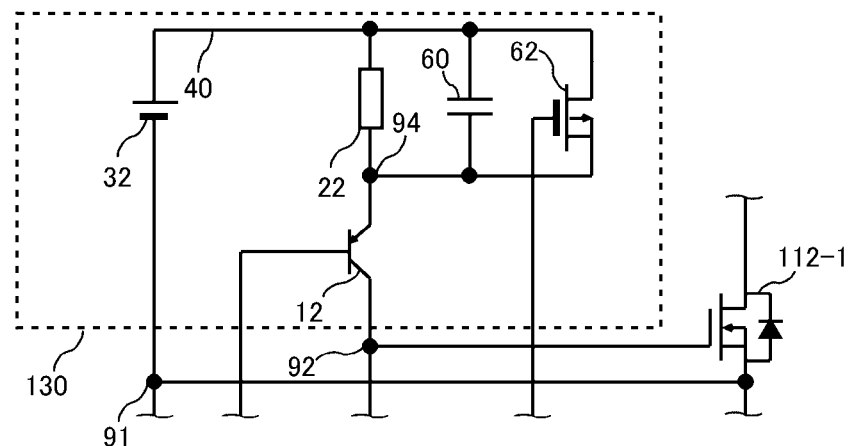
FIG. 23 shows another configuration example of the high-potential-side circuit 130.

FIG. 23 shows another configuration example of the high-potential-side circuit 130. The high-potential-side circuit 130 in this example includes a second capacitor 60 and a second discharge control unit 62 in addition to the configuration of the high-potential-side circuit 230 shown in FIG. 1. The second capacitor 60 in this example is provided in parallel with the first resistor element 22 between the connection point 94 and the high potential line 40. The second discharge control unit 62 in this example also controls whether to discharge the second capacitor 60. The second discharge control unit 62 discharges the second capacitor 60 at similar timings to the examples described above by referring to FIG. 14-22.

The second discharge control unit 62 in this example is provided in parallel with the second capacitor 60. The second discharge control unit 62 in this example is a transistor for controlling whether to connect two electrodes of the second capacitor 60. However, the configuration of the second discharge control unit 62 is not limited to this. The second discharge control unit 62 may discharge the second capacitor 60 at any timing independently of the second switching control unit 12. Also in this example, the reverse-recovery surge voltage can be suppressed, the turn-on time can be shortened, and the second capacitor 60 can be discharged fast.

The driving apparatus 110 may be configured by combining, as appropriate, any of the reference-potential-side circuits 140 illustrated in FIG. 2-12 with any of the high-potential-side circuits 130 illustrated in FIG. 14-23. In this case, the driving apparatus 110 can shorten the turn-off time and the turn-on time without increasing the surge voltage or the reverse-recovery surge voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A driving apparatus for driving a switching device, the driving apparatus comprising:
   a high potential line;
   a high-potential-side switching control unit configured to perform switching as to whether to connect a control terminal of the switching device to the high potential line;
   a first resistor element located on a high-potential side and disposed in series with the high-potential-side switching control unit on a path from the control terminal of the switching device to the high potential line;
   a high-potential-side capacitor provided in parallel with the first resistor element on the path from the control terminal of the switching device to the high-potential-side switching control unit;
   a high-potential-side discharge control unit configured to control whether to discharge the high-potential-side capacitor; and
   a high-potential-side diode disposed between the control terminal of the switching device and the high-potential-side capacitor.

2. The driving apparatus according to claim 1, wherein the high-potential-side discharge control unit is configured to discharge the high-potential-side capacitor with a condition that a control voltage on the control terminal of the switching device is equal to or higher than a plateau voltage.

3. The driving apparatus according to claim 1, wherein the switching device is either device of a pair of switching devices operated in a complementary manner, and the high-potential-side discharge control unit is configured to discharge the high-potential-side capacitor during a period from a completion of turning-on of the switching device to be driven to a start of next turning-off of the switching device.

4. The driving apparatus according to claim 1, wherein the first resistor element is disposed between the control terminal of the switching device and the high-potential-side switching control unit, and the high-potential-side capacitor is disposed in parallel with the first resistor element between the control terminal of the switching device and the high-potential-side switching control unit.

5. The driving apparatus according to claim 2, wherein the first resistor element is disposed between the control terminal of the switching device and the high-potential-side switching control unit, and the high-potential-side capacitor is disposed in parallel with the first resistor element between the control terminal of the switching device and the high-potential-side switching control unit.

6. The driving apparatus according to claim 3, wherein the first resistor element is disposed between the control terminal of the switching device and the high-potential-side switching control unit, and the high-potential-side capacitor is disposed in parallel with the first resistor element between the control terminal of the switching device and the high-potential-side switching control unit.

7. The driving apparatus according to claim 1, wherein a capacitance of the high-potential-side capacitor is variable, and the driving apparatus further comprises a capacitance control unit configured to control the capacitance of the high-potential-side capacitor.

8. The driving apparatus according to claim 1, further comprising:

a reference potential line having a lower potential than the high potential line;

a reference-potential-side switching control unit configured to perform switching as to whether to connect the control terminal of the switching device to the reference potential line;

a first resistor element located on a reference-potential side and disposed in series with the reference-potential-side switching control unit on a path from the control terminal of the switching device to the reference potential line;

a reference-potential-side capacitor provided, in parallel with the first resistor element located on the reference-potential side, on the path from the control terminal of the switching device to the reference potential line; and a reference-potential-side discharge control unit configured to control whether to discharge the reference-potential-side capacitor.

9. The driving apparatus according to claim 1, wherein at least one of the switching device or the high-potential-side discharge control unit is a wide bandgap semiconductor element containing at least one of silicon carbide, gallium nitride, gallium oxide, or diamond as a main material.

10. The driving apparatus according to claim 1, wherein the high-potential-side discharge control unit is a transistor device, a photocoupler, a digital isolator, a mechanical relay, or a photodiode.

11. A driving apparatus for driving a switching device, the driving comprising:

a high potential line;

a high-potential-side switching control unit configured to perform switching as to whether to connect a control terminal of the switching device to the high potential line;

a first resistor element located on a high-potential side and disposed in series with the high-potential-side switching control unit on a path from the control terminal of the switching device to the high potential line;

a high-potential-side capacitor provided in parallel with the first resistor element on the path from the control terminal of the switching device to the high-potential-side switching control unit;

a high-potential-side discharge control unit configured to control whether to discharge the high-potential-side capacitor; and a high-potential-side diode disposed in parallel with the first resistor element between the control terminal of the switching device and the high-potential-side capacitor, wherein the first resistor element is disposed between the control terminal of the switching device and the high-potential-side switching control unit.

12. The driving apparatus according to claim 11, wherein the high-potential-side discharge control unit is a high-potential-side switch disposed between the high potential line and a connection point between the high-potential-side diode and the high-potential-side capacitor.

13. The driving apparatus according to claim 12, further comprising:

a second resistor element located on the high-potential side and disposed in series with the high-potential-side diode between the control terminal of the switching device and a connection point between the high-potential-side capacitor and the high-potential-side discharge control unit.

14. The driving apparatus according to claim 12, further comprising:

a third resistor element located on the high-potential side and disposed in series with the high-potential-side switch between the high potential line and the connection point between the high-potential-side capacitor and the high-potential-side switch.

15. The driving apparatus according to claim 14, wherein a resistance value of the third resistor element is variable, and the driving apparatus further comprises a resistance control unit configured to control the resistance value of the third resistor element.

16. The driving apparatus according to claim 12, further comprising:

a fourth resistor element located on the high-potential side and disposed in series with the high-potential-side capacitor between a connection point between the high-potential-side switching control unit and the first resistor element and a connection point between the high-potential-side diode and the high-potential-side discharge control unit.

17. The driving apparatus according to claim 16, wherein a resistance value of the fourth resistor element is variable, and the driving apparatus further comprises a resistance control unit configured to control the resistance value of the fourth resistor element.

18. The driving apparatus according to claim 13, wherein a resistance value of the second resistor element is variable, and the driving apparatus further comprises a resistance control unit configured to control the resistance value of the second resistor element.

19. The driving apparatus according to claim 13, further comprising:

a third resistor element located on the high-potential side and disposed in series with the high-potential-side switch between the high potential line and the connection point between the high-potential-side capacitor and the high-potential-side switch.

20. The driving apparatus according to claim 13, further comprising:

a fourth resistor element located on the high-potential side and disposed in series with the high-potential-side capacitor between a connection point between the high-potential-side switching control unit and the first resistor element and a connection point between the high-potential-side diode and the high-potential-side switch.

21. A driving apparatus for driving a switching device, the driving apparatus comprising:

a high potential line;

a high-potential-side switching control unit configured to perform switching as to whether to connect a control terminal of the switching device to the high potential line;

a first resistor element located on a high-potential side and disposed in series with the high-potential-side switching control unit on a path from the control terminal of the switching device to the high potential line;

a high-potential-side capacitor provided in parallel with the first resistor element on the path from the control terminal of the switching device to the high-potential-side switching control unit; and a high-potential-side discharge control unit configured to control whether to discharge the high-potential-side capacitor, wherein the high-potential-side switching control unit is provided between one electrode of the high-potential-side capacitor and the high potential line, and the high-potential-side discharge control unit is provided in parallel with the high-potential-side switching control unit and provided between another electrode of the high-potential-side capacitor and the high potential line.

* * * * *